(12) United States Patent
Ibe et al.

(10) Patent No.: US 8,904,233 B2
(45) Date of Patent: Dec. 2, 2014

(54) ELECTRONIC APPARATUS

(75) Inventors: Hidefumi Ibe, Kawasaki (JP);
Tadanobu Toba, Yokohama (JP);
Kenichi Shimbo, Yokohama (JP);
Hitoshi Taniguchi, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 155 days.

(21) Appl. No.: 13/522,551

(22) PCT Filed: Feb. 9, 2011

(86) PCT No.: PCT/JP2011/052704
§ 371 (c)(1),
(2), (4) Date: Aug. 7, 2012

(87) PCT Pub. No.: WO2011/102270
PCT Pub. Date: Aug. 25, 2011

(65) Prior Publication Data
US 2012/0304005 A1 Nov. 29, 2012

(30) Foreign Application Priority Data
Feb. 18, 2010 (JP) ................. 2010-033654

(51) Int. Cl.
*G06F 11/00* (2006.01)
*G06F 11/14* (2006.01)
*G01R 31/00* (2006.01)

(52) U.S. Cl.
CPC .......... *G06F 11/1405* (2013.01); *G01R 31/00* (2013.01)
USPC ............................. 714/17; 714/15

(58) Field of Classification Search
CPC .................. G06F 11/1405; G01R 31/00
USPC ........................................ 714/17, 15
See application file for complete search history.

(56) References Cited

U.S. PATENT DOCUMENTS 5,780,907 A 7/1998 Ema et al.
7,401,273 B2 * 7/2008 Lee et al. ............. 714/724
(Continued)

FOREIGN PATENT DOCUMENTS

JP 8-97378 4/1996
JP 9-129830 5/1997
(Continued)

OTHER PUBLICATIONS

T. Calin et al., Upset Hardened Memory Design for Submicron CMOS Technology, IEEE Transactions on nuclear Science, Dec. 1996, pp. 2874-2878, vol. 43, No. 6.
Norbert Seifert et al., Impact of Scaling on Soft-Error Rates in Commercial Microprocessors, IEEE Transactions on Nuclear Science, Dec. 2002, pp. 3100-3106, vol. 49, No. 6.
Eishi Ibe et al., Spreading Diversity in Multi-cell Neutron-Induced Upsets with Device Scaling, IEEE 2006 Custom Intergrated Circuit Conference (CICC).
(Continued)

*Primary Examiner* — Yolanda L Wilson
(74) *Attorney, Agent, or Firm* — Antonelli, Terry, Stout & Kraus LLP.

(57) ABSTRACT

A failure caused by a soft-error including MNU, of an electronic apparatus is prevented, while suppressing increase of a mounting area, power consumption, and processing time. The electronic apparatus stores data indicating the state of a flip-flop included in a sequential logic circuit within an arithmetic unit, each time when execution is performed on a check point provided for every predetermined number of instructions. When a symptom of a soft-error is detected, the apparatus sets the state of the flip-flop included in the sequential logic circuit within the arithmetic unit, based on the data stored after execution of the instruction at the immediately preceding check point, and restarts execution from the next instruction, being subsequent to the instruction associated with the immediately preceding check point.

9 Claims, 30 Drawing Sheets

(56) References Cited

U.S. PATENT DOCUMENTS

| | | |
|---|---|---|
| 2005/0144513 A1 | 6/2005 | Nakamura et al. |
| 2006/0212753 A1 | 9/2006 | Sato |
| 2007/0180317 A1* | 8/2007 | Hirotsu et al. .................. 714/17 |
| 2008/0222465 A1* | 9/2008 | Redgrave et al. ............. 714/724 |
| 2009/0138772 A1* | 5/2009 | Bertacco et al. ............. 714/733 |
| 2009/0249141 A1 | 10/2009 | Yasuda |
| 2009/0293042 A1 | 11/2009 | Nakagawa et al. |

FOREIGN PATENT DOCUMENTS

| | | |
|---|---|---|
| JP | 2003-46644 | 2/2003 |
| JP | 2005-165599 | 6/2005 |
| JP | 2006-260259 | 9/2006 |
| JP | 2009-169515 | 7/2009 |
| JP | 2009-246629 | 10/2009 |
| JP | 2010-3291 | 1/2010 |

OTHER PUBLICATIONS

David G. Mavis et al., SEU and SET Modeling and Mitigation in Deep Submicron Technologies, IEEE 2007 45$^{th}$ annual International Reliability Physics Symposium, Phoenix.

Japanese Standard Association JIS C 0508 Functional safety of electrical/electronic/programmable electronic safety-related systems (2000).

Tao Wang et al., A Novel Bulk Built-In Current Sensor for Single-Event Transient Detection, SELSE6, Stanford University, Mar. 23-24, 2010.

S.A. Bota et al., Cross-BIC architecture for single and multiple SEU detection enhancement in SRAM memories, IEEE 2010 16$^{th}$ International On0Line Testing Symposium, pp. 141-146.

Egas Henes Neto et al., A Built-In Current Sensor for High Speed Soft Errors Detection Robust to Process and Temperature Variations, SBCCI, Sep. 3-6, 2007, Rio de Janeiro, Brazil.

* cited by examiner

ELECTRONIC APPARATUS

FIG. 11
NODE INFORMATION (node1、node2、node3、node4)
- INITIAL STATE (1)
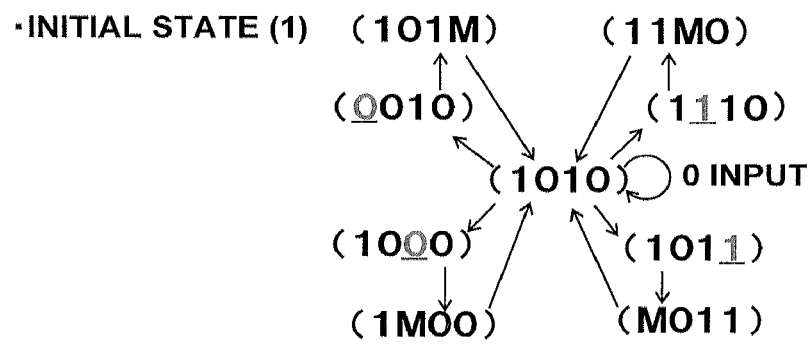
- INITIAL STATE (2)
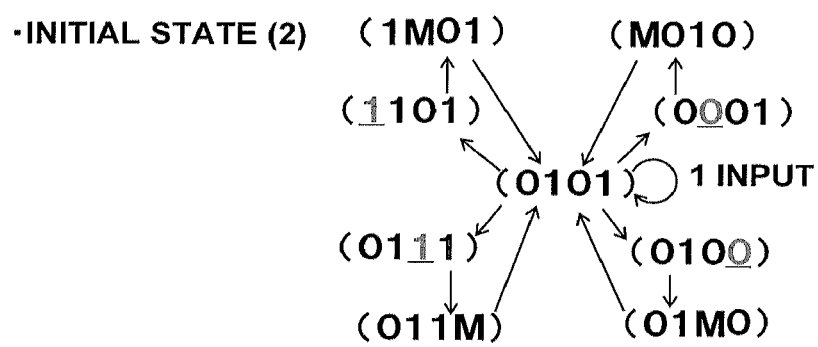
M: INTERMEDIATE POTENTIAL OUTPUTTED
WHEN BOTH nMOS AND pMOS ARE TURNED ON

FIG. 20

MAJOR CALCULATION RESULT (DATA PATTERN: CB)

| DESIGN RULE | CAPACITY | SOFT-ERROR RATE | | MCU RATE | MCU MAXIMUM SIZE | MAXIMUM MCU MULTIPLICITY | SET RATE** | AVERAGE PULSE WIDTH | AVERAGE PEAK CURRENT |
|---|---|---|---|---|---|---|---|---|---|
| nm | Mbit | FIT/device | FIT/Mbit | % | bit | bit | FIT/device | ns | mA |
| 130 | 16 | 2093 | 131 | 7 | 459 | 10 | 548 | 0.08 | 0.5 |
| 90 | 32 | 4174 | 130 | 14.8 | 14940 | 16 | 1724 | 0.2 | 0.24 |
| 65 | 64 | 6754 | 106 | 21.2 | 114170 | 19 | 2620 | 0.26 | 0.12 |
| 45 | 128 | 9283 | 73 | 27.2 | 118665 | 48 | 4145 | 0.25 | 0.16 |
| 32 | 256 | 12778 | 50 | 38.5 | 1932765 | 52 | 6229 | 0.23 | 0.1 |
| 22 | 512 | 14745 | 29 | 46 | 463638 | 175 | 8722 | 0.25 | 0.07 |

\* NEUTRON SPECTRUM IS BASED ON JESD89A, AND VALUES ON NEW YORK OCEAN SURFACE ARE USED. DATA PATTERN IS CHECKERBOARD.
\* BIPOLAR MODE MODEL IS NOT INCLUDED.
\*\* ASSUME CELLS OF THE SAME NUMBER AS SRAM. ASSUME ALL SET PULSES BEING GENERATED END WITH ERROR.

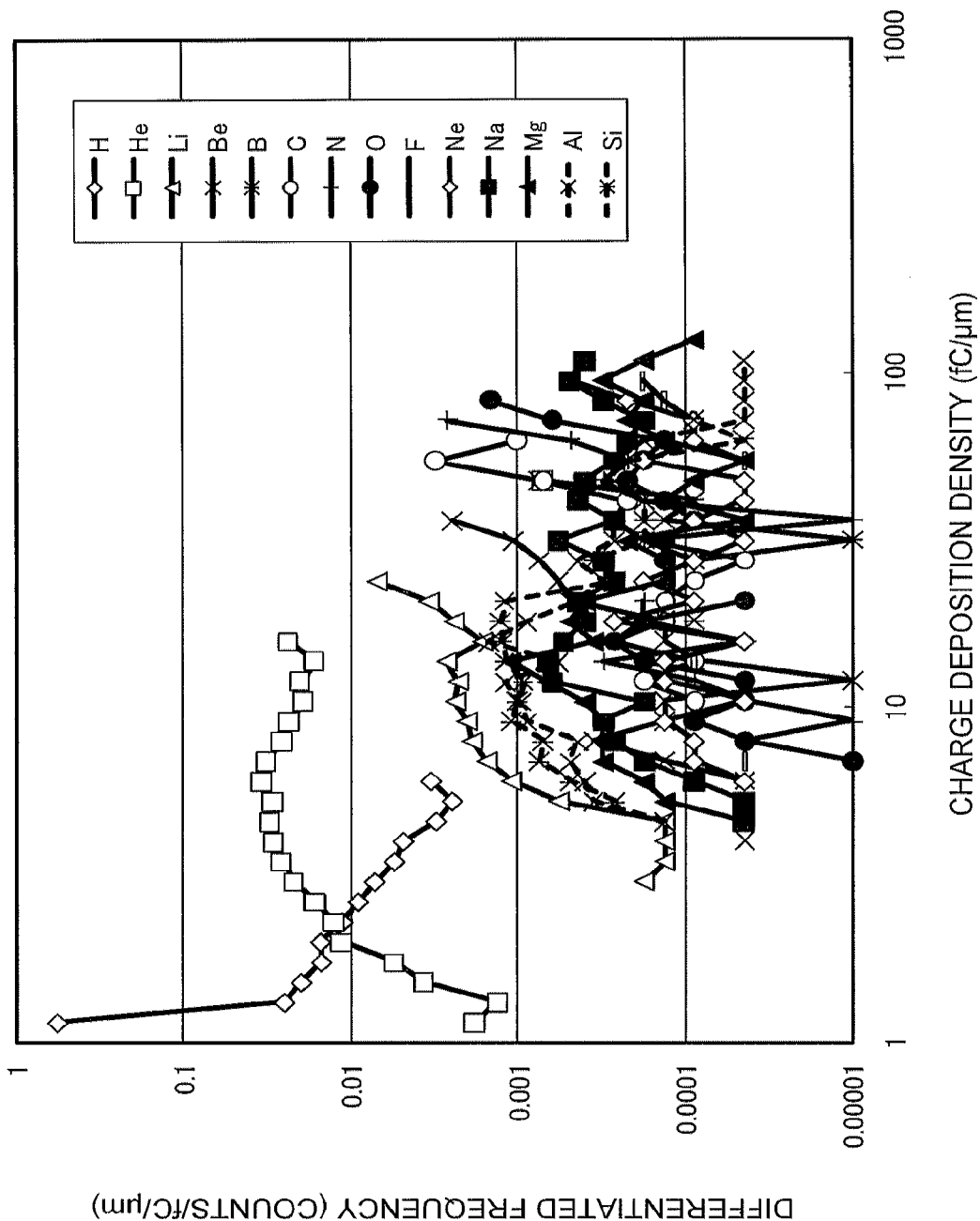

ELECTRONIC APPARATUS

TECHNICAL FIELD

The present invention relates to a technique for avoiding a failure caused by a soft-error. This application claims priority to Japanese Patent Application No. 2010-033654 filed on Feb. 18, 2010, the entire contents of which are incorporated by reference herein, in the designated countries where incorporation of documents by reference is approved.

BACKGROUND ART

Along with the progress in scaling of a semiconductor device, soft-error problems caused by environmental radiation (such as terrestrial neutrons and $\alpha$-rays) are becoming obvious, in particular, on SRAM (Static Random Access Memory), logic gates, and a clock system. When neutrons reach the ground, with extraordinarily high energy, they run into nucleus constituting the device, intra-nuclear nucleons (neutrons and protons) repeat collision, and nucleons with extra-high energy are emitted outside.

When the nucleons go into the state where kinetic energy is not able to be held any more, the energy being necessary for the nucleons to emit to the outside of the nucleus, the next process is that light particles such as protons, neutrons, deuterons, and alpha particles, evaporate from residual nucleus in the excited state, and finally, the residual nucleus also hold recoil energy, resulting in that all the secondary particles jump within the device by the distances corresponding to their ranges respectively.

When $\alpha$-rays generated from a radio isotope included in a semiconductor package or the like, or secondary ions holding a charge being generated as a result of nuclear reaction, pass through a depletion layer of a storage node of the SRAM in the state of "high", the storage node collects a charge equal to or more than the charge initially generated in the depletion layer, according to a funneling mechanism where the node absorbs electrons, holes flow in the reverse direction, and then a charge collection area is expanded along the tracks of the ions. When the charge being equal to or more than a critical charge is collected, which is necessary for reversing data, the "high" state shifts to the "low" state, and an error occurs in the data being held. This is referred to as a soft-error.

DICE (Dual Inter-locked storage CELL) is known as a countermeasure against the soft-error on a flip-flop (see the Non Patent Document 1). The DICE is a tolerance gaining technique utilizing limitation of MOS structure and an intermediate output, and FIG. 10 shows a basic circuit configuration. When the node logical state is represented by (node 1, node 2, node 3, and node 4), the initial state is represented by only (1, 0, 1, 0) or (0, 1, 0, 1). If it is assumed that the node 1 becomes error (0) from the state of (1, 0, 1, 0), the node 4 is turned ON in both PMOS, and nMOS, and accordingly, the state falls into midpoint potential. Then, at the next clock input time (there are two inputs, a signal input and a feedback, and constantly either one is ON and the other is OFF), the midpoint potential serves as a gate potential of the nMOS of the node 1, but the node 1 maintains "1", because the pMOS is kept ON. In the similar manner, even though there is an error in any of the nodes including the reverse initial state, the initial state is resumed. The process above is illustrated as the state transition diagram shown in FIG. 11.

As a countermeasure against the soft-error in an electronic system, there are known the techniques such as TMR (Triple Module Redundancy), Duplication+Comparison+checkpoint (referred to as DMR, or also referred to as Double Module Redundancy), and Replication+rollback.

In the TMR, three module systems are prepared, and the same instruction is executed in each of the three modules. The result is determined by a rule of majority using a voter and the execution from the next stage keeps on, whereby a normal processing is executed even though any soft-error occurs in one module.

In the Duplication+Comparison+checkpoint, necessary number of check points are provided within the execution flow of the instruction, and parameters required for executing the instruction at the check point are stored. The same instruction is executed in two module systems, and execution results from the both modules are compared. As a result of the comparison, if there is no agreement between two results, it is regarded as occurrence of error subsequent to the check point, and the same process is executed after returning to the check point. This allows execution of the normal processing, even when the soft-error occurs in either of the modules.

In the Replication+rollback, the same instruction is executed twice in one module, and if there is no agreement between the first execution result and the second execution result, the instruction is executed again. Accordingly, even when the soft-error occurs, it is possible to execute the normal processing.

PRIOR ART DOCUMENT

Non Patent Document

Non Patent Document 1: T. Calin, M. Nicolaidis, and R. velazco, "Upset hardened memory design for submicron CMOS technology", IEEE Trans. Nuclear Science, Vol. 43, No. 6, pp. 2874-2878 December 1996

SUMMARY OF THE INVENTION

Problem to be Solved by the Invention

Along with the progress in scaling of a semiconductor device in recent years, a distance between neighboring nodes is prone to be shortened, and there occurs a problem of MNU (Multi-Node Upset) that a charge generated by occurrence of secondary ions, being caused by one-time $\alpha$-rays or nuclear reaction, exerts influence on multiple nodes.

In the DICE described above, if the soft-error occurs both in the node 1 and in the node 3 simultaneously, this state is stabilized at the next clock time as it is, and thus it is not possible to perform error recovery. In other words, according to the DICE, if the MNU occurs simultaneously in the node 1 and the node 3, or, in the node 2 and the node 4, the error is locked.

In the TMR, if the soft-error occurs in multiple modules at one time, there is a possibility that the module with the error is taken as a result of the rule of majority, and it is far from a solution for the MNU. In addition, the TMR requires three modules to be prepared for one process and operates those modules concurrently, and therefore, there is another problem that increases a mounting area and power consumption.

Also in the Duplication+Comparison+checkpoint, when the soft-error occurs in both the two modules, it results in that the process proceeds while keeping the error state, and this cannot be a countermeasure against the MNU. In addition, it is necessary to prepare two modules for one process and operate those modules concurrently, and this increases the mounting area and power consumption.

In the Replication+rollback, the same process is executed at different timing. Therefore, even if the soft-error occurs at any of the timing in multiple nodes, there is no impact on the process executed at the other timing, and thus a problem of the MNU does not occur. However, in the Replication+rollback, since all the processes are executed constantly two times, it doubles the processing time. There is another problem that it doubles the power consumption.

The present invention has been made considering the situations above, and an object of the present invention is to prevent a failure of an electronic apparatus, the failure being caused by a soft-error including MNU, while suppressing increase of a mounting area, power consumption, and processing time.

Means to Solve the Problem

In order to solve the problems above, the electronic apparatus according to the present invention stores data indicating the state of a flip-flop included in a sequential logic circuit within an arithmetic unit, each time when execution is performed on a check point provided for every predetermined number of instructions. When a symptom of a soft-error is detected, the electronic apparatus sets the state of the flip-flop included in the sequential logic circuit within the arithmetic unit, based on the data stored after execution of the instruction at the immediately preceding check point, and restarts execution from the next instruction, being subsequent to the instruction associated with the immediately preceding check point.

By way of example, the present invention is directed to an electronic apparatus, having a function for avoiding a failure caused by a soft-error, including, an instruction executing part for executing an instruction sequentially according to a program being set, by using an arithmetic unit held by the electronic apparatus, a data holder for holding data indicating the state of a flip-flop included in the sequential logic circuit within the arithmetic unit, a symptom detector for detecting a symptom of the soft-error, and a controller for allowing the data holder to hold the data indicating the state of the flip-flop included in the sequential logic circuit within the arithmetic unit at a time point when the execution of the instruction associated with a check point is ended, for the case where the instruction executing part executes the instruction associated with the check point without detecting the symptom of the soft-error by the symptom detector; and for the case where the symptom detector detects the symptom of the soft-error, the controller providing a directive to the instruction executing part to stop executing the instruction, setting the state of the flip-flop included in the sequential logic circuit within the arithmetic unit, based on the data held by the data holder, and providing a directive to the instruction executing part to restart executing the next instruction, being subsequent to the instruction associated with the checkpoint immediately preceding.

Effect of the Invention

According to the electronic apparatus of the present invention, it is possible to prevent the failure caused by the soft-error including MNU, while suppressing the increase of a mounting area, power consumption, and processing time.

BRIEF DESCRIPTION OF DRAWINGS

FIG. 11 is a diagram showing a state transition of the tolerant latch DICE suggested by Calin;

FIG. 20 is a compiled chart showing scaling effects on the neutron soft-error;

FIG. 21 illustrates a relationship between the charge density and the frequency for generating each secondary ion within Si;

BEST MODE FOR CARRYING OUT THE INVENTION

Hereinafter, an overview of an embodiment of the present invention and the embodiment of the present invention will be explained in detail, with reference to the accompanying drawings. It is to be noted that in the entire drawings for explaining the embodiment and the overview thereof, the same members are labeled the same in principle, and tedious explanations will not be made.

The present invention is based on new findings from a series of experiments and simulations obtained by the inventors, and firstly, those findings will be explained.

[1. MNU Mode: Experimental Findings as to Expansion of Impact]

Non Patent Document 2 below describes that in a logical device, when neighboring nodes become closer along with the progress in scaling, a charge being generated is distributed across multiple nodes (charge sharing), and therefore, errors may occur simultaneously in the pertinent nodes due to MNU (Multi-Node Upset). The highly tolerant FF (flip-flop) latch described in the Background Art above is based on space or time redundancy, but this document also describes that if multiple nodes are employed in this redundancy-based measure, the MNU may disable the measure for obtaining tolerance.

Non Patent Document 2:

Seifert, N., Zhu, X., Massengill, L. W., "Impact of Scaling on Soft-Error Rates in Commercial Microprocessors," TNS, Honolulu, Hi., July 23-27, Vol. 49, No. 6, pp. 3100-3106 (2002)

Figure 12:
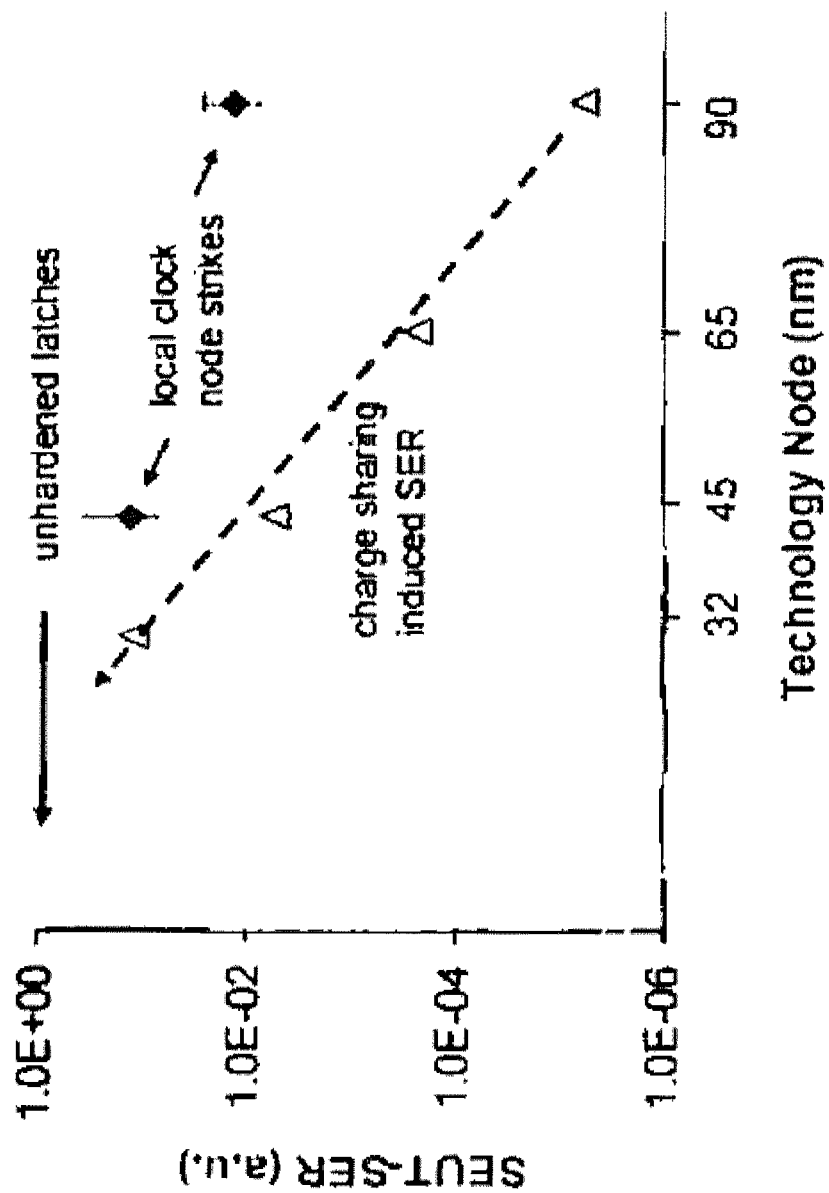
FIG. 12 illustrates an analysis result that the SEUT being a measure for developing tolerance is being disabled as the scaling progresses, together with a rate of the soft-error caused by a noise in a clock system.

FIG. 12 illustrates an example of such analysis and an actual measurement example. As shown in FIG. 12, as for the SEUT (Single Event Upset Tolerant), the error rate increases along with the progress in scaling, and it is predicted that upon entering 32 nm process, the tolerance is disabled, falling to the level of the FF with no countermeasure.

On the other hand, there are shown actual measurement values in the same figure, and it is pointed out that a significant problem is the errors caused by SET (Single Event Transient) which enters the clock system. As for the FF, as shown in the aforementioned Non Patent Document 2, the SET entering a global SET/RESET system may also be a cause of the MNU, and therefore, a domain which needs countermeasures is wider than the memory.

Figure 13:
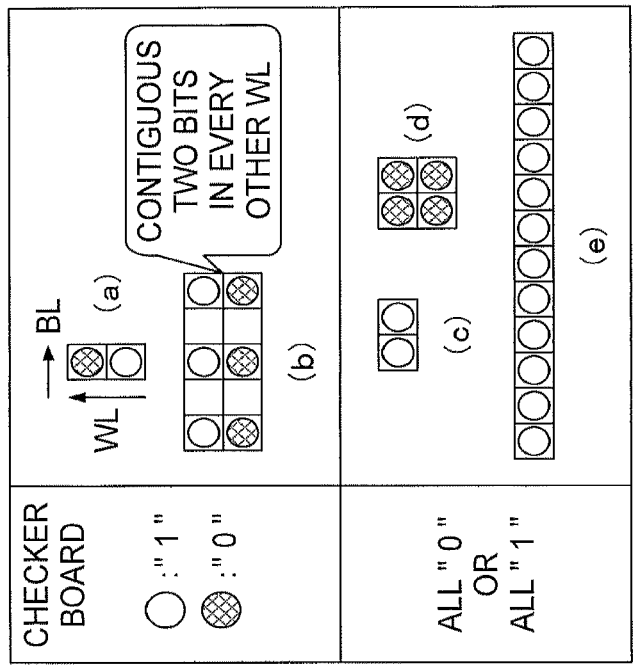
FIG. 13 illustrates a two-dimensional arrangement pattern of error bits, corresponding to a new error mode MCBI.

The inventors have found that there is an alternative mode which may be a cause of the MNU in a similar way, based on an experiment of neutron irradiation. The experiment was conducted on the SRAM, and as illustrated in FIG. 13, it was clarified that there were various two-dimensional patterns of error bits, depending on data patterns. In other words, in the checkerboard (CB) pattern where "0" and "1" arrangement is made alternately both in the vertical direction and in the horizontal direction, an error where two bits are arranged side by side in the word line direction, is arranged every two bits in the bit line direction; and in the data pattern of all 0's or all 1's errors occur continuously in one line in the bit line direction.

The inventors have clarified the mechanism of the aforementioned MNU, after going through the simulation analysis, and named it as MCBI (Multi-Coupled Bipolar Interaction).

In other words, when ions pass through a pn junction within a p-well, the electron generated within the p-well is absorbed into the n-side, and a hole remains within the p-well, raising the potential, turning a part of transistor to be ON (SES: Single Event Snapback), thereby allowing current to flow. This works as the first step to induce a change in the potential in the surroundings, turning a parasitic thyristor ON, and thereby exhibiting a phenomenon that errors result in a large number of "High" nodes within the p-well.

The MCBI resembles SEL (Single Event Latchup), but in the SEL, errors expand both in the word line and in the bit line over several thousands of bits, and no restoration is expected unless power cycle (power source restart) is executed. On the other hand, the MCBI is significantly different from the SEL, because the expansion of errors is limited to neighboring two bits at a maximum in the word line direction, around 10 bits being extended only in the bit line direction, and restoration is possible by rewriting.

Figure 30:
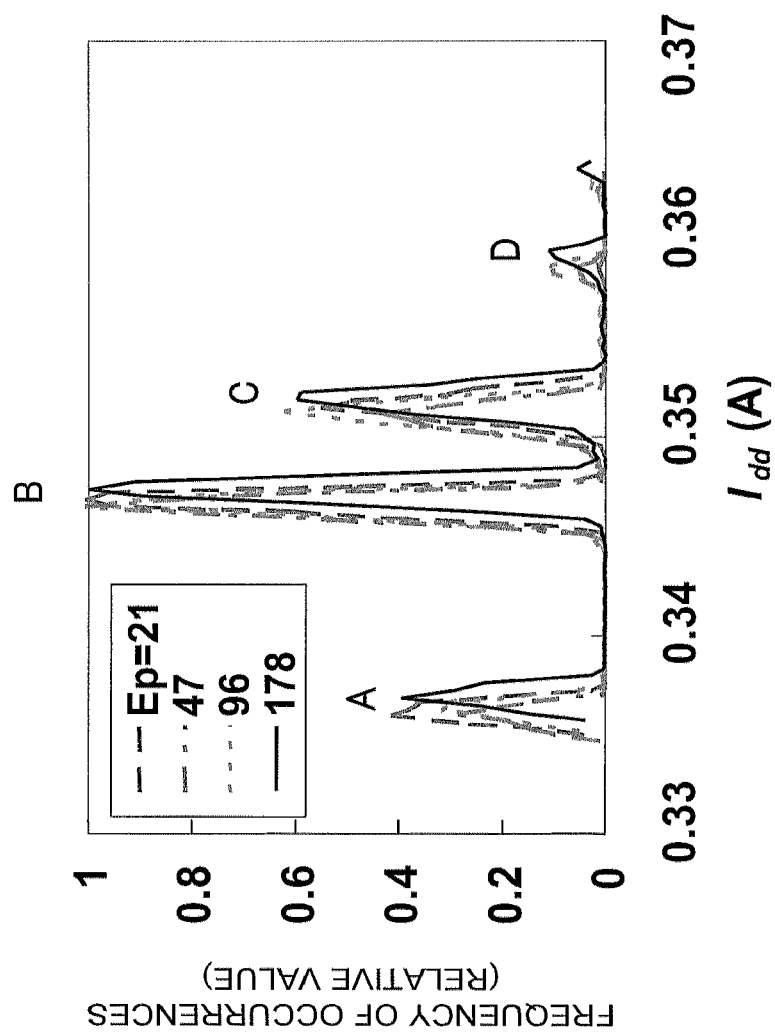
FIG. 30 illustrates a relationship between the MNU multiplicity and current values for the case of MCBI.

FIG. 30 shows variations of power source current Idd as to four points of Ep, the current being measured by using a quasi-monoenergetic neutron source (a neutron source having a narrow frequency peak on a specific neutron energy Ep). As shown in FIG. 30, the MCBI has a characteristic that when it occurs for the power source current value A with no occurrence of errors, discrete current peaks B, C, and D appear in association with the multiplicity of error bits (2, 3, and 4 bits), respectively.

Multi-node upset (MNU) which causes errors concurrently at multiple logical nodes may disable an effect of the redundant system, and cause a fault simultaneously at input nodes of the logic gate having multiple inputs.

The MCBI may extend to continuously up to 12 bits at a maximum in the 130-nm process SRAM, but as for the MCU of a type arranged in one line in the WL direction, there is no MCU extending 3 bits or more for this type, out of approximately 2,500 MCUs. It is possible to predict that a perfect countermeasure can be taken against the MCBI, if the interleaving distance is set to be 3 bits or more and ECC is provided, as disclosed by the inventors using the simulation which does not consider the MCBI theoretically (e.g., see the Non Patent Document 3 described below).

Non Patent Document 3:

E. Ibe, S. Chung, S. Wen, H. Yamaguchi, Y. Yahagi, H. Kameyama, S. Yamamoto, T. Akioka, "Spreading Diversity in Multi-cell Neutron-Induced Upsets with Device Scaling," 2006 CICC, San Jose, Calif., Sep. 10-13, 2006, pp. 437-444 (2006).

On the other hand, as for in the highly tolerant FF latch collectively described in the Background Art, it is possible to serve as a countermeasure against the SNU (Single Node Upset), but it does not serve as a countermeasure against the MNU, in general, similar to the case of DICE. Even though this point is left out of consideration, each of the techniques above has penalties, such as being large in area, large in power consumption, and a speed problem, and they should be used for a limited part.

[2. Findings Based on the Simulation Regarding Expansion of MNU Impact]

The inventors have already developed simulation code CORIMS for analyzing a soft-error in a semiconductor device, caused by environmental neutron rays, including MNU, and the details of the simulation code are collectively described in the aforementioned Non Patent Document 3. With regard to the present invention, a scaling effect was predicted as to the soft-error in the CMOS device up to the 22-nm process. Hereinafter, an overview of the model and a result of the analysis will be presented.

A. Simulation Model
(i) Nuclear Spallation Reaction Model

Extra-high energy cosmic rays (mainly protons), originally generated in galactic nucleus, collide with nucleus in the atmosphere, such as oxygen and nitrogen, causing nuclear spallation reaction, and thereby generating the environmental neutron rays. The energy thereof extends to several GeVs. Since the high energy neutron does not hold a charge, when they collide with a device, they just pass through it, in many cases. If there is a reaction with the nucleus of an element constituting the semiconductor device (mainly, Si), even at a low probability, the nuclear spallation reaction occurs here as well, thereby generating secondary ions with high energy.

This nuclear spallation reaction is originally a many body problem, but in the CORIMS, this is solved by replacing this problem with a cascade of two-step relativistic binary collision problem. The first step corresponds to a process (referred to as Intra-Nuclear Cascade, INC) where incident neutrons sequentially collide with the nucleons (protons and neutrons) and scatter within the nucleus, and partial nucleons are emitted to the outside of the nuclear, resulting in generating a residual excited nucleus. The second step corresponds to a process subsequent to the INC, where the light particles (protons, neutrons, alpha particles, and the like) "evaporate" from the residual excited nucleus.

Figure 14:
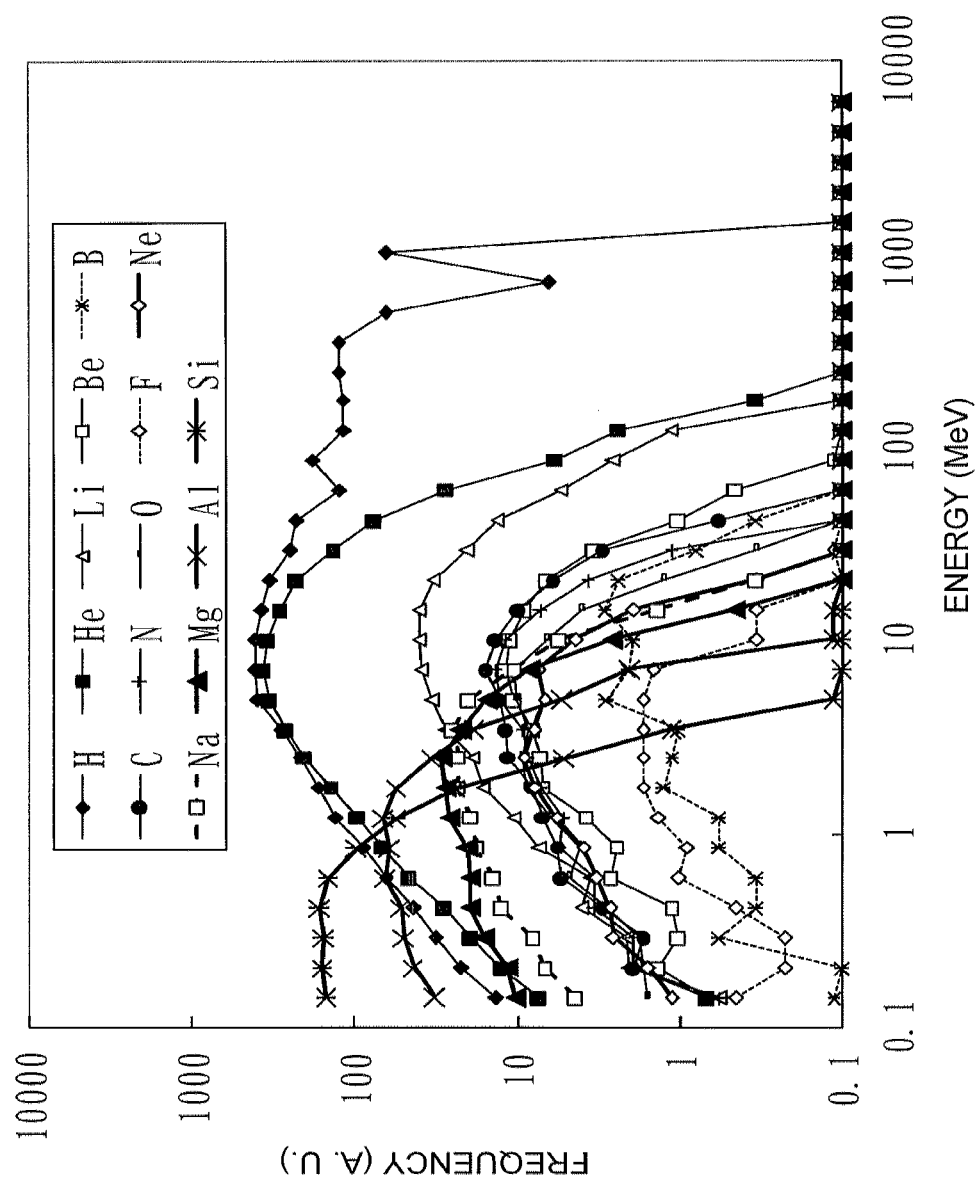
FIG. 14 illustrates energy spectrum of secondary ions generated by a nuclear reaction between environmental neutron rays and Si.
Figure 15:
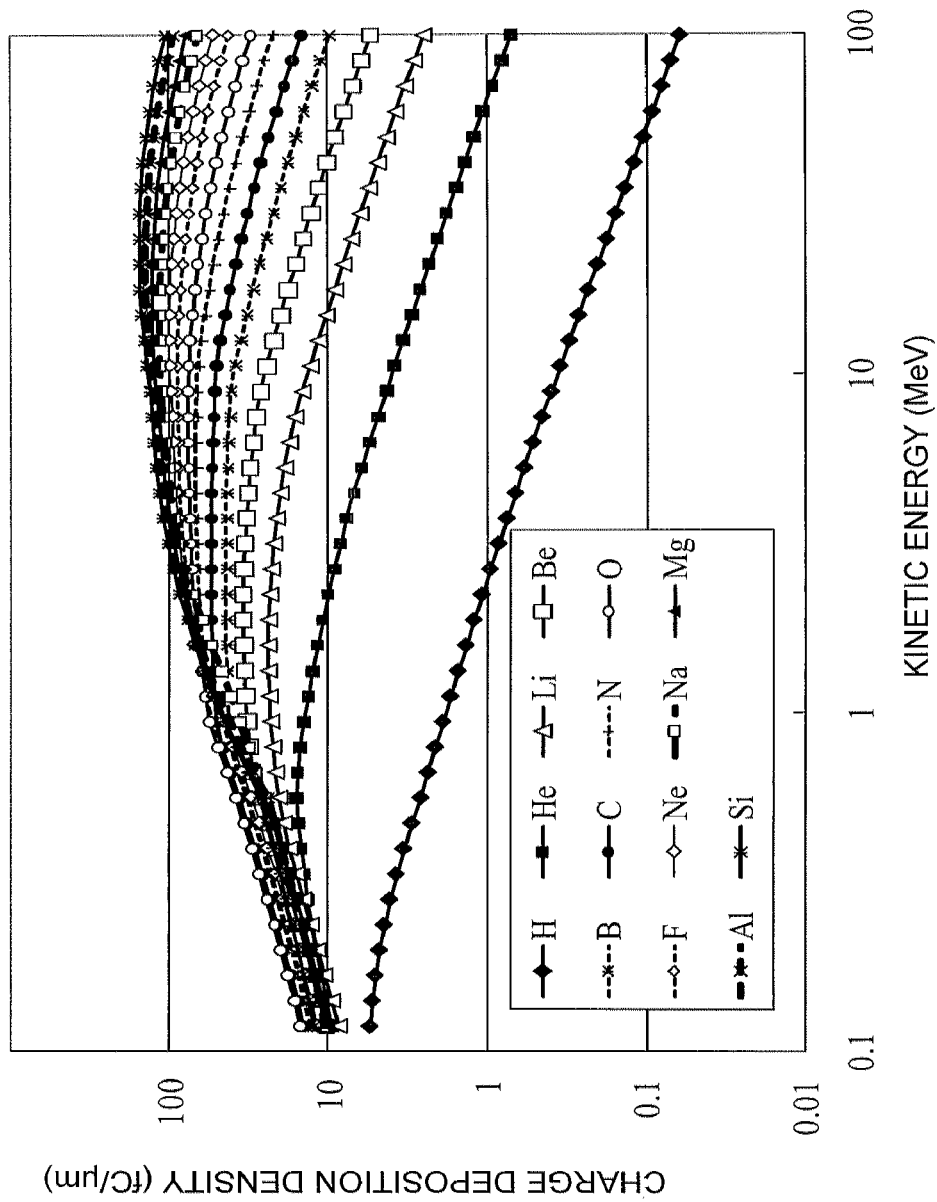
FIG. 15 illustrates calculated values of charge density of the electron (hole) generated in Si, in association with energy of ions.
Figure 16:
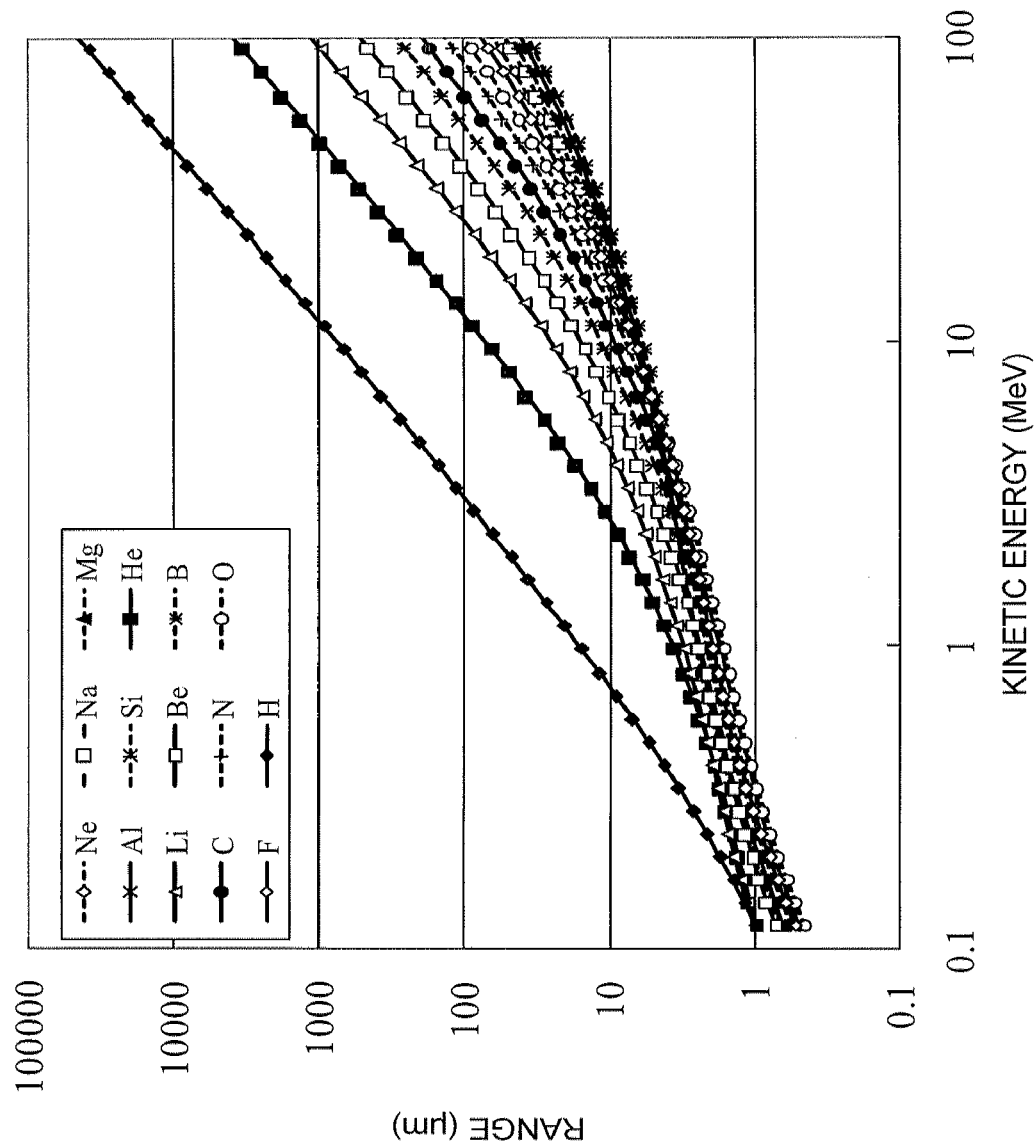
FIG. 16 illustrates ranges within Si, in association with the energy of ions.

In the evaporation process, a particular reaction channel is emitted at a specific probability, and the GEM model is employed for calculating the probability. The secondary ions include all types of elements that may be generated from Si, and they are mainly, Mg, Al, proton, He (alpha particle). As a spectrum of the environmental neutron rays on the ground, the spectrum presently disclosed in JESD89A is defined as an international standard spectrum on the New York ocean surface. The shape of the spectrum is unchangeable, but it may fluctuate due to various factors, such as a solar activity, geomagnetic latitude, an altitude, and atmospheric pressure. In particular, the altitude has a large impact, and the intensity at an avionics altitude is around 100 times stronger than the intensity on the ocean surface. FIG. 14 shows energy spectrum of each of the representative secondary ions which are generated in association with the neutron spectrum on the New York ocean surface calculated by the CORIMS. FIG. 15 and FIG. 16 illustrate calculation results of the ranges within Si in the associated energy domain, and the energy deposition density (the density of a material through which the ions pass is multiplied by Linear Energy Transfer: LET in the unit of MeV/(mg/cm$^2$) to obtain an energy deposition amount per unit length, and it is converted to the charge deposition density based on the calculation result according to SRIM).

Since it is necessary to satisfy the law of conservation of linear momentum, most of kinetic energy is transferred to the light particles (protons, and alpha particles). As for a heavy particle, the heavier is the particle, the smaller becomes the kinetic energy such as equal to or less than several dozen of MeV, and therefore its range becomes dozens of micrometers or less. As for the light particle, the range becomes more than several tens of millimeters, but obviously from FIG. 15, the charge deposit density of the light particles drastically decreases when the energy becomes 10 to 100 Mev or more, and this means that, in practice, it is possible to ignore most of contribution to the soft-error according to the high-energy light particle.

(ii) Charge Collection Model

When the secondary ions pass through the depletion layer (pn junction) immediately under the storage node in the state of "High" data in the SRAM, a pair of generated electron and hole flow along the electric field within the depletion layer, the electron being directed to the node and the hole being directed to the reverse direction thereof in the nMOSFET. With the move of the generated charge, the electric field within the depletion layer extends over a long distance from the node along the tracks of ions (referred to as a funneling effect), resulting in that much more charge than the initial charge in the depletion layer is collected.

As the model implemented in the CORIMS, Hu funneling model is employed, and a funneling length $x_c$ is calculated according to the formula (1) described below.

$$x_c = \left(1 + \frac{\mu_e}{\mu_h}\right)\frac{W}{|\cos\theta|} \quad (1)$$

Here, $\mu_e$ and $\mu_h$ represent the mobility of electron and that of the hole, respectively, W represents a thickness of the depletion layer, and $\theta$ represents a traveling direction of the ion by a zenith angle.

Charge collection efficiency $\eta$ according to the funneling is calculated by the following formula (2). Here, it is assumed that the distance $x_c$ decreases in an exponential manner, and $L_{max}=4$ µm is used.

$$\eta = \exp\left(-\frac{x_c}{L_{max}}\right) \quad (2)$$

Further in a triple well structure, in the case where the secondary ions pass through the pn junction on the lower surface of the p-well, even though the ions do not pass through a diffusion layer, the charge is collected by a diffusion drift. In the CORIMS, a virtual charge collection area having a width of 0.1 µm is provided immediately below the diffusion layer, and the calculation is made assuming that the charge generated in this area is also collected by the diffusion layer.

(iii) Device Model

The CORIMS divides a transistor and a surrounding structure of the device into multiple rectangular parallelepiped components included in a multiple layered structure, automatically reads layouts from GDS2 file, and establishes a three-dimensional model based on profile information with regard to the depth direction. The rectangular parallelepiped component is replaced by vertex coordinates, constituent edge lines, and surface information, and coordinates where the secondary ions pass through and energy are precisely calculated, with support from CAD algorithm.

Figure 17:
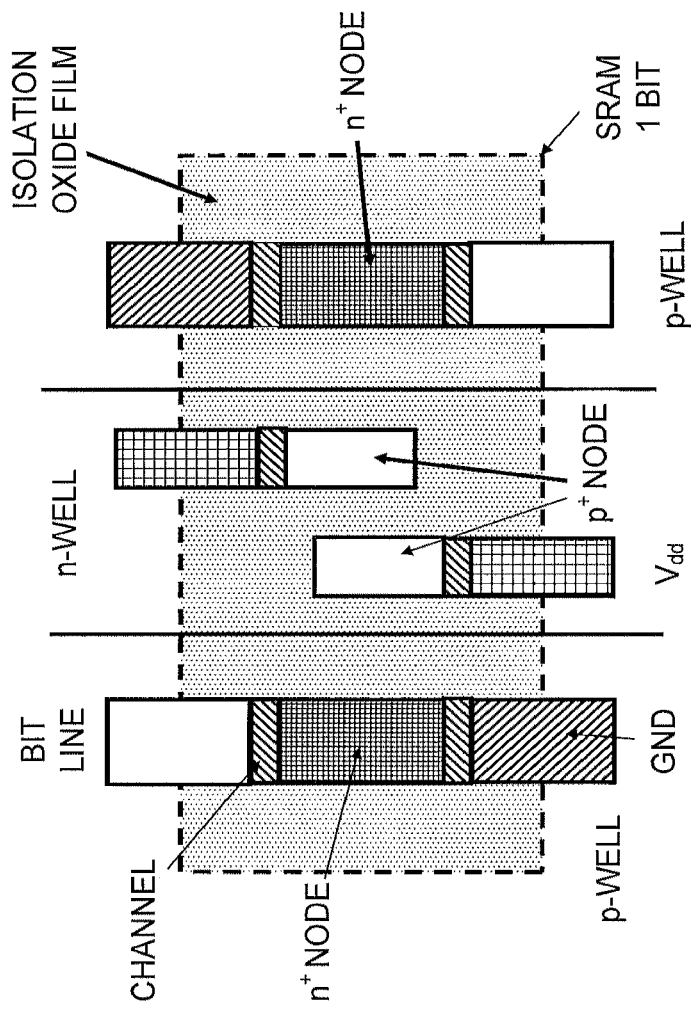
FIG. 17 shows a two-dimensional layout of the SRAM.

FIG. 17 shows a basic structure of the SRAM model. By using the scaling function implemented in the CORIMS, scaling is performed on the planar structure and layout in such a manner that homothetic scaling is performed in conformity to the overall scaling rate, whereas the depth direction is assumed as kept constant.

(iv) Cell Matrix Model

Error bits may expand to 50 µm within Si, which will be described below. Therefore, considering of scaling up to 22 nm may result in that passing through the device spans several thousands of bits or more. A matrix model where memory cells being a model of detailed structure are arranged across such domain may require extremely large storage capacity, and this is not realistic.

Figure 18:
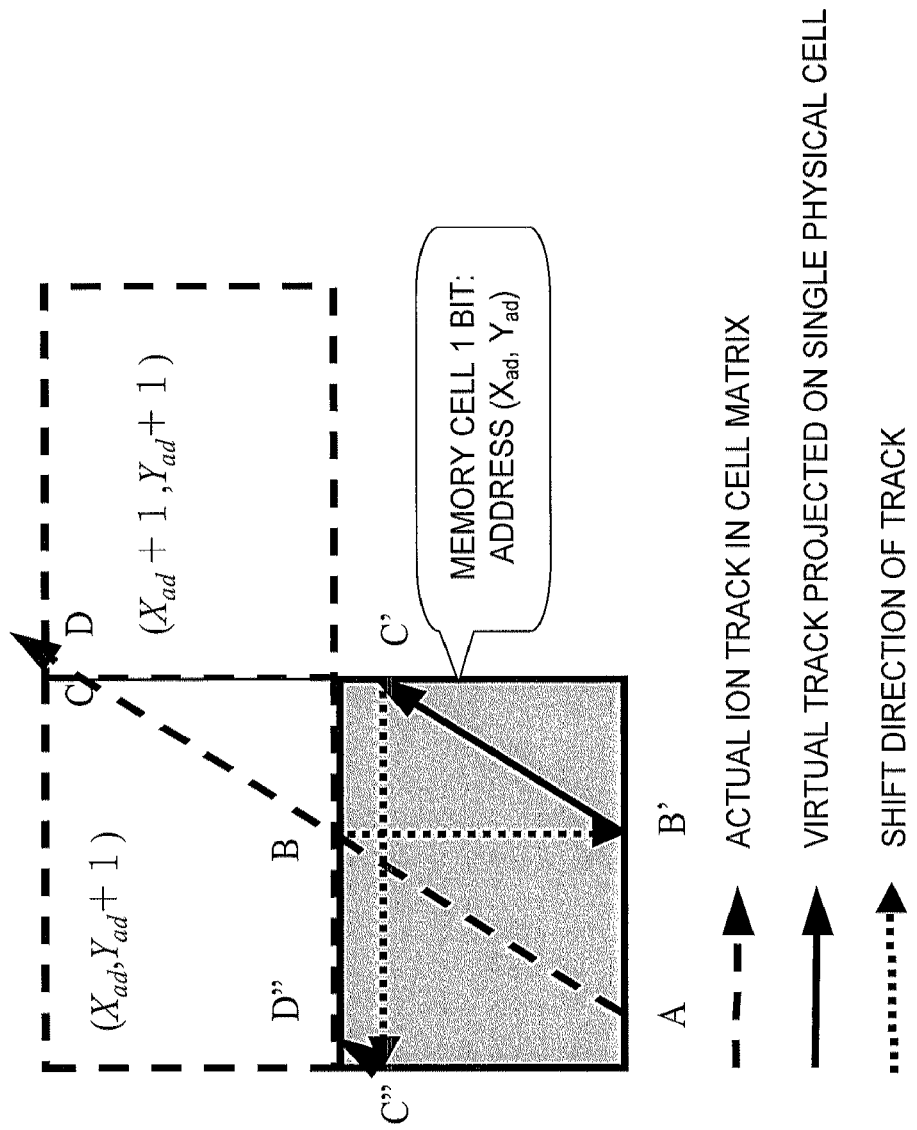
FIG. 18 illustrates a concept of DCS (Dynamic Cell Shift) for calculating charge generation along the tracks in the memory cell.

Therefore, as shown in FIG. 18, the CORIMS employs a method referred to as a dynamic shift (DCS) model, in which only one physical cell model is provided, and upon reaching an edge face of the cell, an incident position of the secondary ion is made to shift by one bit, and calculation is executed in the same physical model just by allowing the physical address to increase or decrease according to the shift. In the memory matrix, the area is reduced by sharing power source voltage (Vdd) and ground (Vss) between neighboring cells, and therefore in many cases, the layout of cell is symmetrically inverted with respect to a boundary (also referred to as mirroring). The DCS model also supports this kind of case.

(v) MCBI Bipolar Effect

An effect of the MCBI, which is getting conspicuous along with the progress in scaling, is a phenomenon as the following; (1) when the secondary ions pass through the pn-junction within the p-well in the CMOSFET device having a triple well structure, electrons flow into the n-layer, resulting in that (2) holes remain and potential within the p-well becomes higher, and neighboring transistors are collectively turned ON, and eventually, (3) errors occur intensively in multiple nodes within the p-well.

This mode occurs simultaneously with the event of charge collection, but the rate of occurrence largely depends on the position where the secondary ions pass through, the direction and energy thereof, and therefore, it is difficult to incorporate a proper model in the CORIMS. The present specification describes only a conventional charge collection model, and does not contain an analysis including the bipolar effect.

(vi) SET Pulse Width Model

Figure 19:
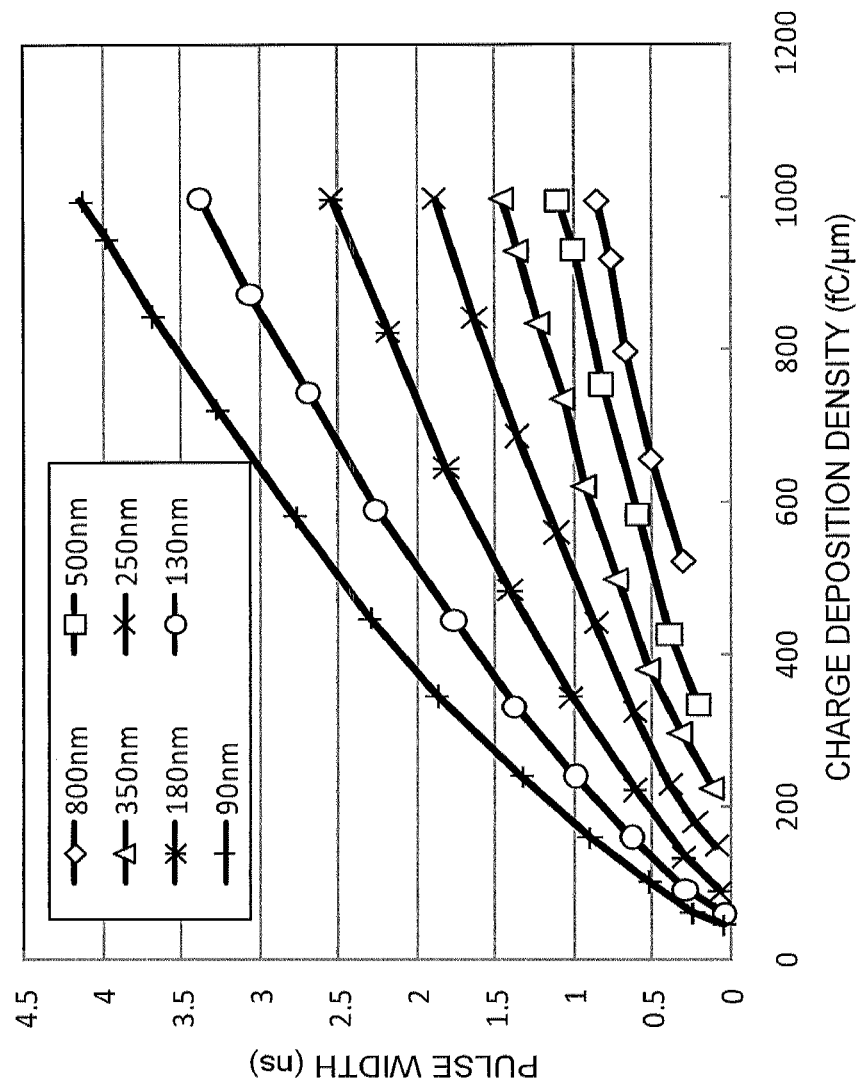
FIG. 19 illustrates the relationship between the designing rule and SET pulse width, as a function of the charge density.

Extrapolating an SET pulse width model as shown in the Non Patent Document 4 described below, polynomial approximation was performed assuming the pulse width up to 22 nm as a function of charge deposition density, so as to conduct calculation. FIG. 19 shows a result of the calculation. With the progress in scaling, the SET pulse width increased, and within the domain of realistic charge deposition density (around 120 fC/$\mu$m), the SET pulse width exceeded 1 ns in the 22 nm process. Therefore, it has been found that a countermeasure against the SET becomes more significant.

Non Patent Document 4:

Mavis, D. G., and Eaton, P. H., "SEU and SET modeling & mitigation in deep submicron technologies," IRPS, Phoenix, Ariz., Apr. 15-19, 2007, No. 4B. 1 (2007)

(vii) Degree of Precision in the CORIMS

As for the CORIMS, there are obtained following results in good agreement with the average margin of error of 20% or less; actual measurement values of the error rate of 130 nm SRAM at three sites in the country, and the results of the error rate measurement of the SRAM, based on the Spallation neutron source at the LANSCE, and the (quasi) mono energetic neutron source at the TSL and the CYRIC. Therefore, the same degree of precision may also be expected in a predictive calculation performed up to the 22 nm.

B. Assumed Road Map and Associated Analysis Conditions

Road map information such as ITRS2007 was studied, and the specifications of the SRAM from 130 nm up to 22 nm were set. A reduction ratio was provided to the two-dimensional cell size, in such a manner that the cell area became half generation by generation. Since there was no road map information for the depth direction, it was assumed as constant for all the generations. Since the critical charge is proportional to the parasitic capacitance, it was assumed that the critical charge decreased in accordance with the area. If an operation voltage decreases, the critical charge is further reduced since it is proportional to a product of the operation voltage and the parasitic capacitance. However, since there are many difficult points technically for actually reducing the operation voltage, this effect was ignored in this instance, and the voltage was kept constant.

C. Analysis Result (i) Overview of the Analysis Result

FIG. 20 illustrates the case where the data pattern is the CB (checkerboard). Here lists the results:

(1) The soft-error rate of the SRAM gradually decreases up to around 1/5 per Mbit, but this decrease is exceeded by the increase in the degree of integration, and the error-rate continuously increases from the 130 nm per device, reaching approximately seven times higher in the 22 nm;

(2) The ratio of the MCU to the total count of events increases generation by generation, and for the 22 nm, it reaches a little less than 50%;

(3) The maximum size of the MCU reaches 1 Mbit between the 45 nm and the 22 nm, and the multiplicity exceeds 100 bits; and (4) An average value of the SET pulse remains at around 0.25 ns, after the 65 nm. As shown in FIG. 19, when the charge deposition density exceeds a certain threshold for each generation, the SET pulse is generated, and this threshold becomes lower along with the progress in scaling. FIG. 20 also shows an upper limit value of SET assuming that when the SET pulses are once generated, all the pulses end with an error. There is a tendency that with the progress in scaling, the value closely approaches the soft-error rate. However, there are many points to be considered, such as lowering of the peak current value, and a difference in masking effect due to complexity of the circuit, and thus more precise evaluation of the model is required for qualification.

Figure 22:
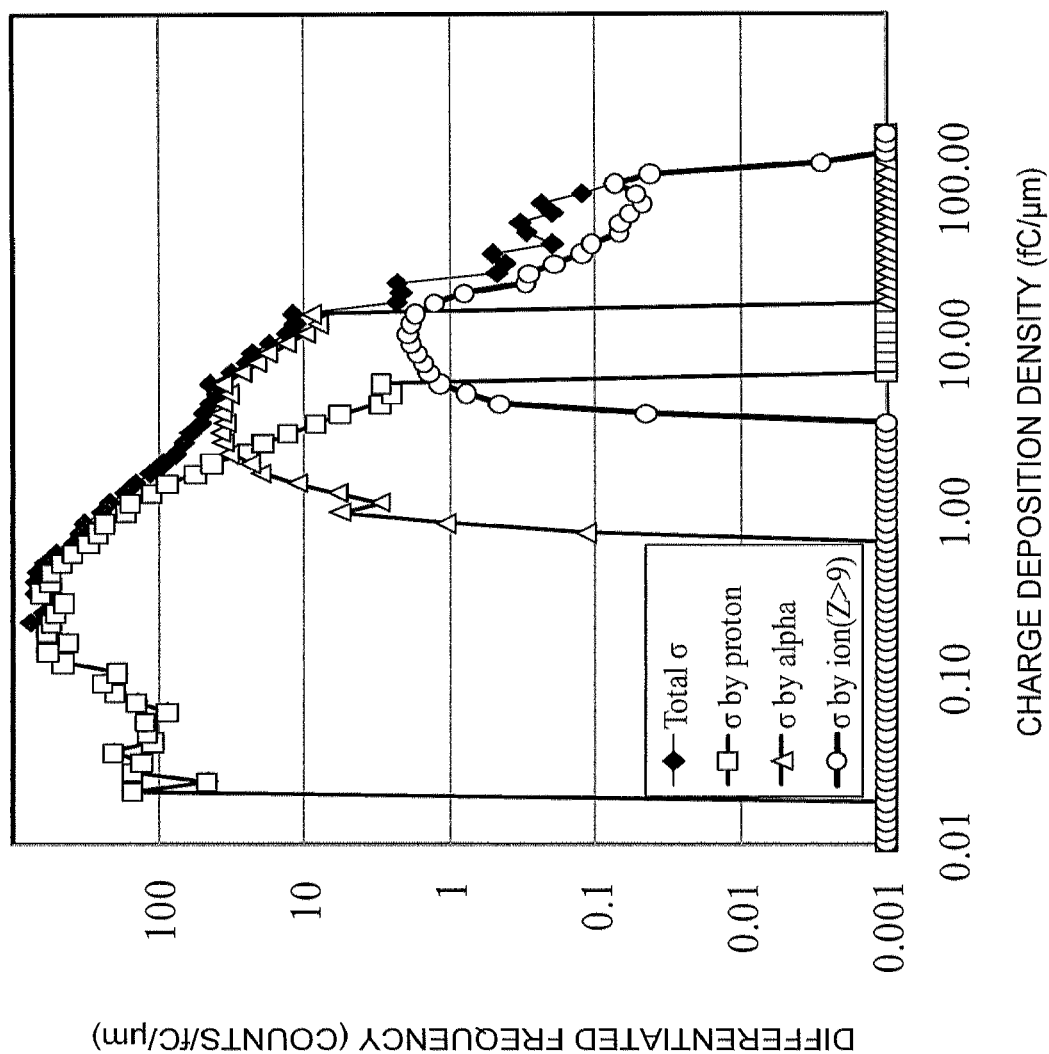
FIG. 22 illustrates a relationship between the charge density and the frequency for generating protons, $\alpha$, heavy ions having the atomic number 10 or more, and total secondary ions within Si.

(ii) Correlations Between the Secondary Ion Species and the Charge Deposition Density FIG. 21 shows the charge density (an amount of charge deposited per unit length) on the node surface, when the secondary ions pass through the storage node, and its frequency (Cross section). FIG. 22 shows a result of the same data, totalizing the data having the atomic number 10 or more other than the proton and the alpha particle.

(1) Though not illustrated clearly in the figure, a result was obtained with no differences in generations. Since it indicates the charge deposition density for the time when the ions pass through the sensitive volume, there is no difference among generations, in principle. The maximum value is approximately 110 fC/$\mu$m, and therefore, it is possible to say that the device with no soft-error sensitivity against this value is provided a perfect tolerance against the error.

(2) As obvious from FIG. 22, for the low charge density (approximately 10 fC/$\mu$m or less), light ions (protons, alpha particles) dominantly contribute to the error. When the charge density is several tens of fC/$\mu$m or more, only heavy ions contribute thereto.

Figure 23:
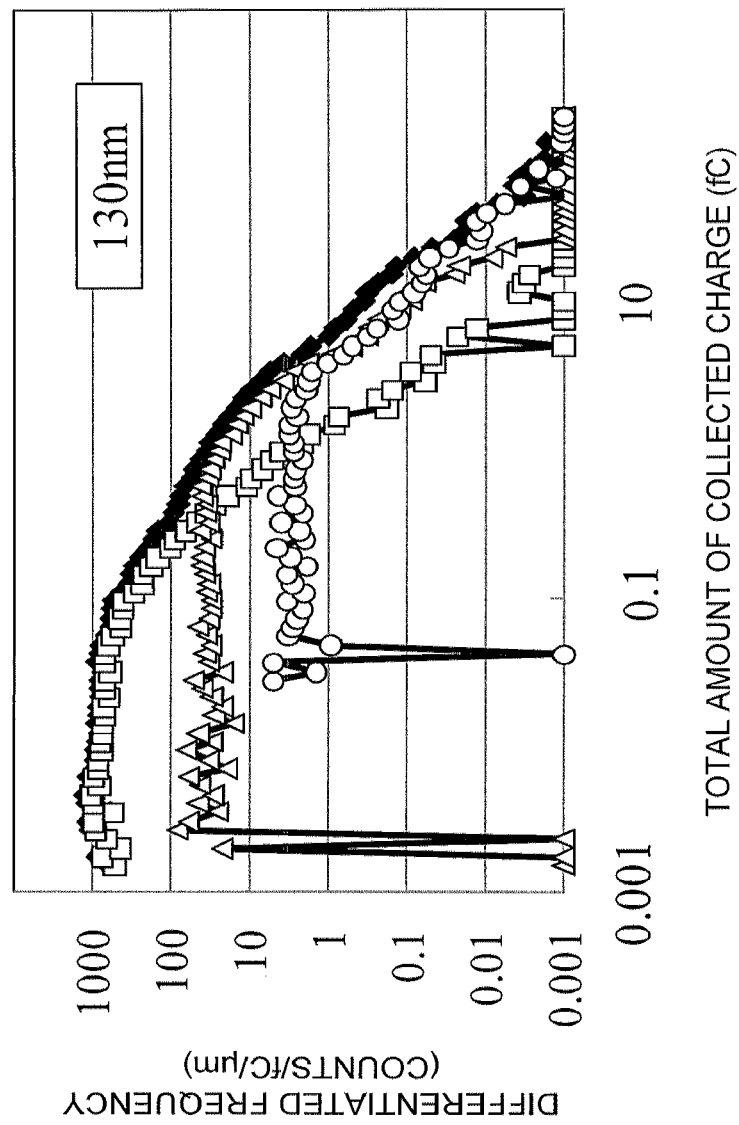
FIG. 23 illustrates a relationship between the total charge and the frequency for generating protons, $\alpha$, heavy ions having the atomic number 10 or more, and total secondary ions within Si, on a 130-nm device.
Figure 24:
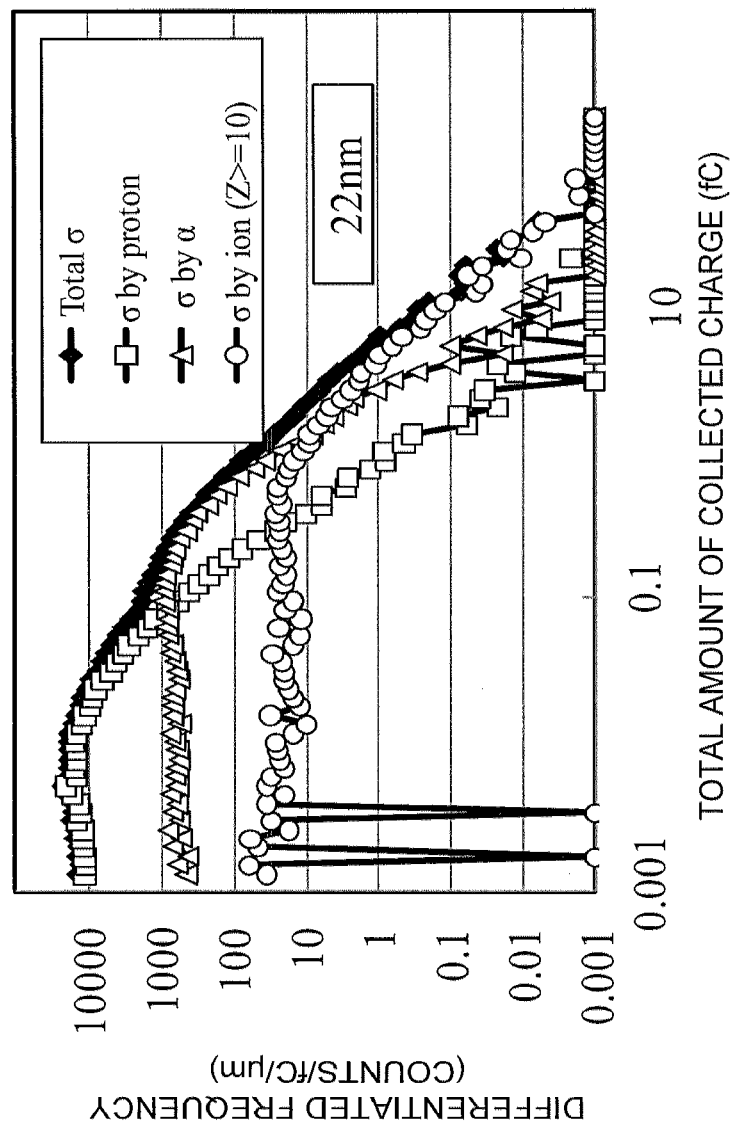
FIG. 24 illustrates a relationship between the total charge and the frequency for generating protons, $\alpha$, heavy ions having the atomic number 10 or more, and total secondary ions within Si, on a 22-nm device.

(iii) Correlation Between Secondary Ion Species and a Total Charge Amount Deposited to the Node As for the charge density, there was not found any differences among generations, but as for the total amount of collected charge, as illustrated in FIG. 23 and FIG. 24, being examples of the 22 nm SRAM and the 130 nm SRAM, there was found a clear difference between generations.

(1) The heavy ion (Z>10) may cause a large amount of charge collection (approximately 36 fC at a maximum), but the probability that the amount of charge deposition becomes small, is less relative to the case of the alpha particle and the proton.

(2) The charge collection amount decreases generation by generation, and there is a tendency to reduce the occurrence of soft-error, but there is no remarkable difference therebetween, because the amount is around 20 fC at a maximum for the 22 nm SRAM, whereas 36 fC at a maximum for the 130 nm SRAM. On the other hand, in the 130 nm SRAM, a pronounced effect cannot be expected even though the critical charge is increased from 5 to 10 fC, whereas in the 22 nm SRAM, it is possible to generate a difference in the soft-error rate according to the change of the critical charge from 10→4→2→1 fC, each difference in the soft-error rate corresponding to one digit or more.

(3) In the domain where the collection charge amount is small, the contribution by the alpha particle and the proton becomes larger, in this order. This domain of charge amount becomes lower and narrower as the generation undergoes evolution. Example: The contribution of alpha particle is approximately 5 fC or less for the 22 nm, whereas 9 fC or less for the 130 nm.

(iv) Variations of Failed Bit Map (FBM)

Figure 25:
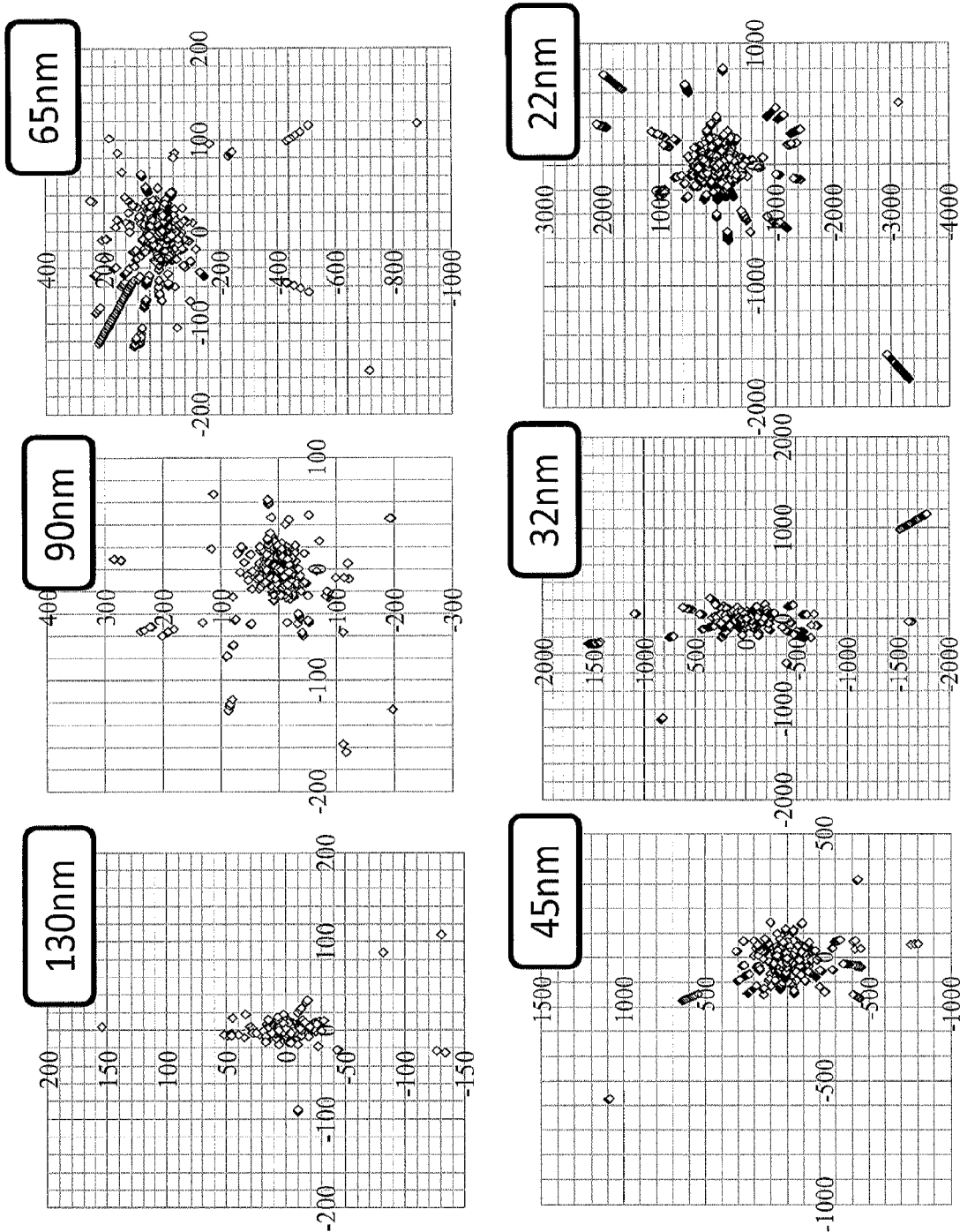
FIG. 25 illustrates variations of FBM, caused by scaling (58003 times of nuclear reactions, the nuclear reaction being developed at the point of origin in the chart)

FIG. 25 shows variations in the FBM distribution of error bits. As shown in FIG. 25, as for the distances of the error bits, there was no remarkable change among the generations, but from the viewpoint of the FBM, there found a major change. The horizontal direction of the figure indicates the WL, and the vertical direction indicates the BL. As shown in FIG. 25, it is found that in the 130 nm, there was a concentration over a few tens of bits vertically and horizontally, whereas in the 22 nm, there were several thousand of bits, and the number of bits increases with an influence of around one digit. This relates to that while the ranges of the second ions do not change, the number of bits being influenced increases due to the reduction of device. In addition, this also relates to the fact that in response to the decrease of the critical charge, the proton and alpha particle, whose ranges are long and the count of occurrences is large, have larger impact.

Figure 26:
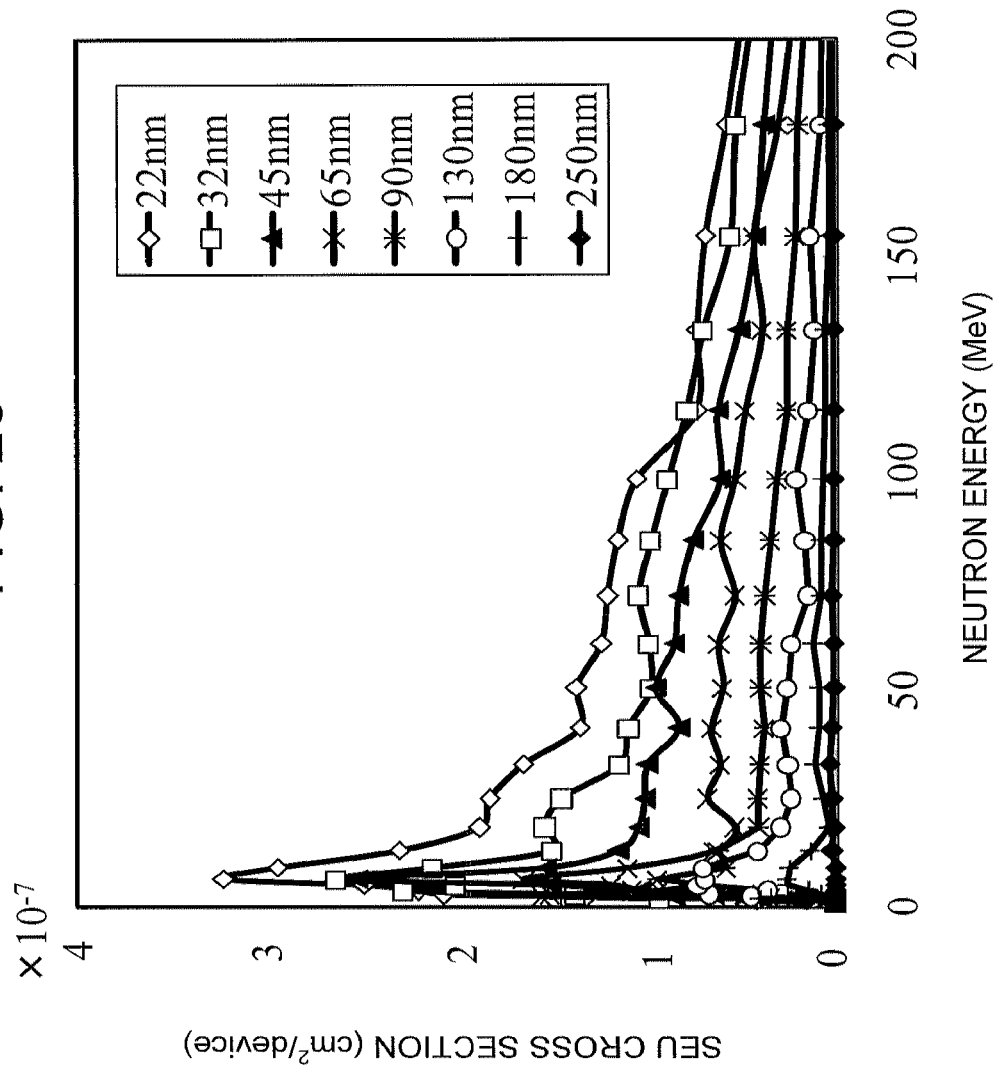
FIG. 26 illustrates variations of excitation function of SEU sectional area, caused by scaling.

(v) Energy Dependency of SEU Cross-Section Variation (1) The SEU cross-section as shown in FIG. 26 represents that the lower energy the neutron has, the larger is its contribution. The tendency that the SEU cross-section has a peak on the lower energy side becomes more remarkable, with the progress in scaling, and the peak position also shifts to the lower energy side. This relates to that the critical charge decreases according to the scaling, and accordingly, the contribution of the protons becomes more conspicuous. In other words, this means that though the generated amount of the protons as a whole was predominantly larger than the other ions, within the bounds where the critical charge was large, the charge deposition density of the protons was extremely smaller than the other ions as shown in FIG. 22. Therefore, though the contribution of the proton to the soft-error was small, when the scaling progressed and the critical charge became smaller, even the proton became able to inverse the data sufficiently. Furthermore, the lower was the energy of the neutron, the smaller became the energy of generated proton, and therefore, also obvious from FIG. 25, it is found that the charge generation density became higher, thereby increasing the rate of error occurrence.

Figure 27:
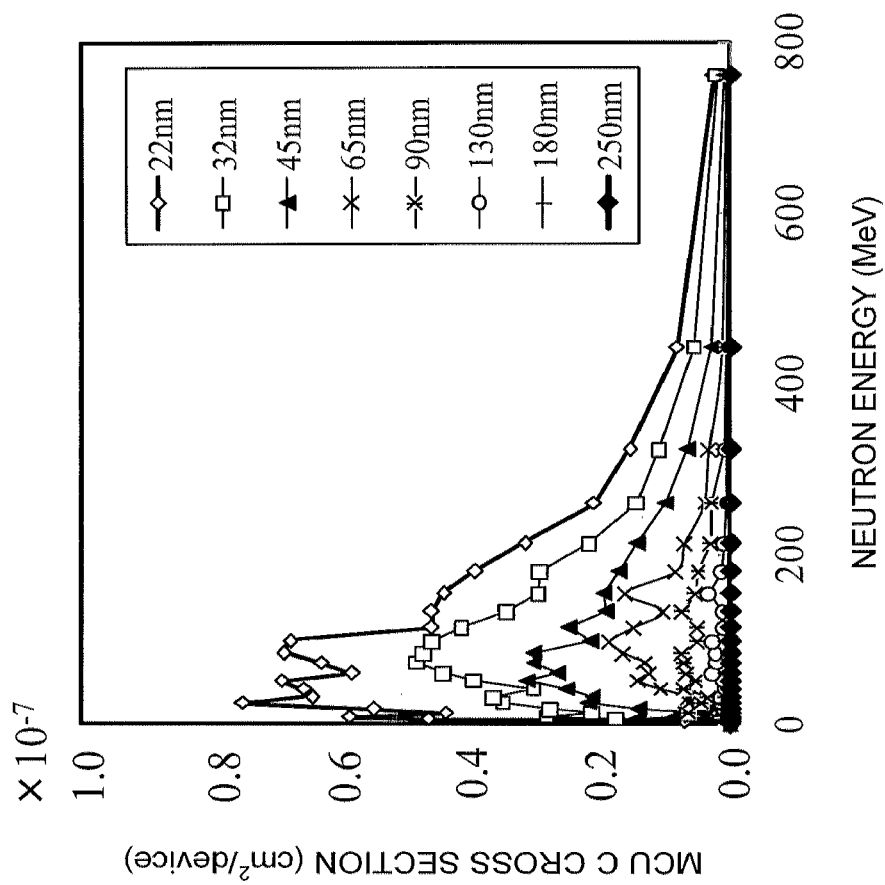
FIG. 27 illustrates variations of excitation function of MCU sectional area, caused by scaling.

(2) As shown in FIG. 27, the cross section of the MCU only relates to a wide domain up to around 200 MeV or more, and a maximum value appeared at around 60 to 100 MeV. There was no major change in shape depending on the scaling. This is because, in the SEU cross-section, there was large contribution of light particles, in particular, protons, whereas in the MCU, there was almost no contribution of protons, and it is conceivable that there was a large contribution of heavy secondary ions. In other words, it is ascribable to the following; along with the progress in scaling, the critical charge becomes smaller, resulting in that the light particles whose count of occurrences is large, has a larger contribution in the SEU, whereas the heavy secondary ion which tends to cause the MCU is prone to be generated more as the neutron energy becomes higher, and thus, low energy neutron has no impact thereon.

(vi) Energy Dependency of the MCU Ratio

Figure 28:
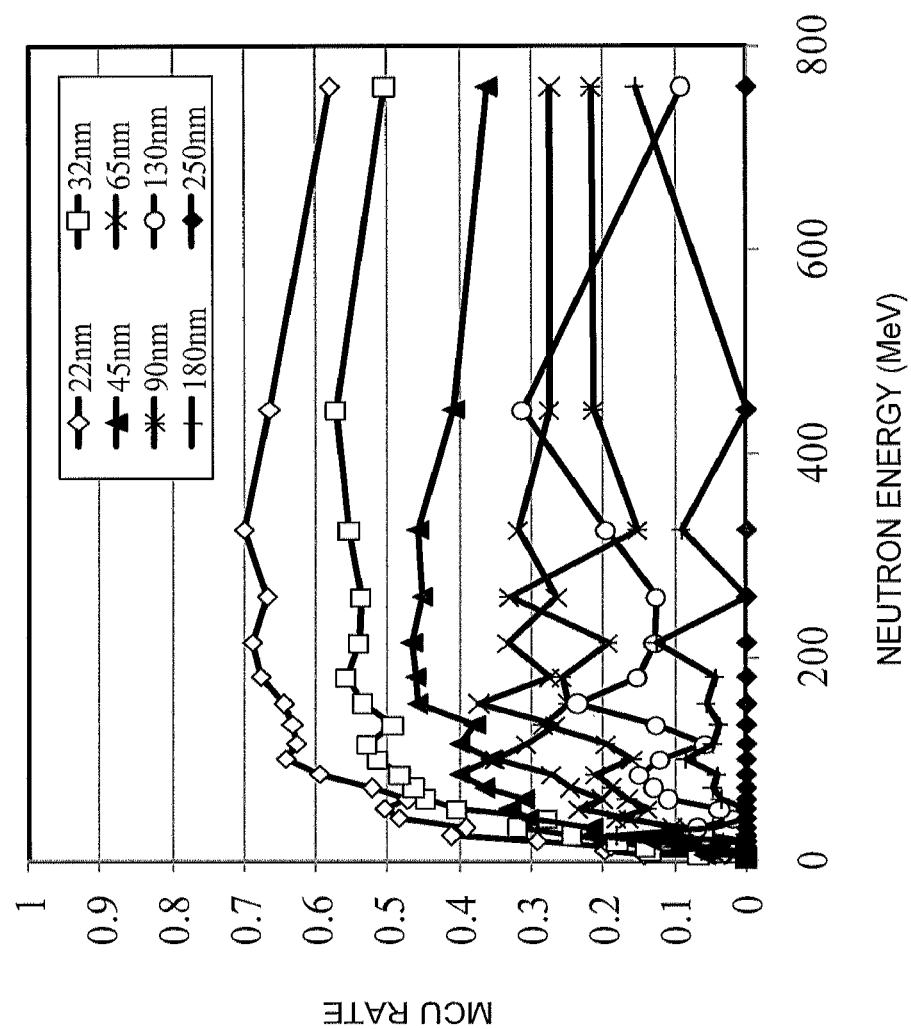
FIG. 28 illustrates variations of energy dependency of MCU ratio, caused by scaling.

FIG. 28 shows the ratio of the MCU to the total number of errors, as a function of the neutron energy. The followings are read from the figure:

(1) The MCU ratio is saturated at around 200 MeV, and gradually decreases on the higher energy side, irrespective of the generation;

(2) A saturation value of the MCU ratio becomes higher, generation by generation, and in the 22 nm, it exceeds 0.5; and (3) Energy generated by the MCU has a threshold of around a few of MeV, and there is a tendency that it decreases a little along with the scaling, but there is not any marked change.

(vii) Shift of MCU Multiplicity Between Generations

Figure 29:
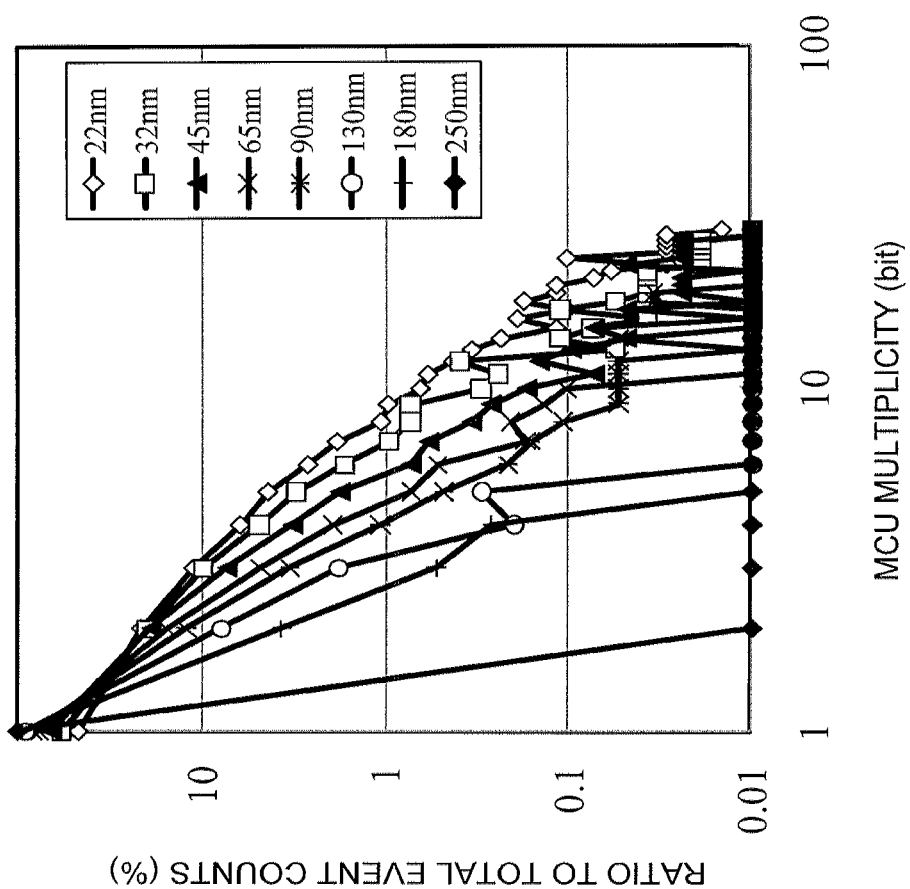
FIG. 29 illustrates variations of MCU multiplicity, caused by scaling.

FIG. 29 shows a calculation result of the MCU multiplicity (the number of errors which occur simultaneously) as to the data pattern represented by all 1's. It is found that there is a tendency that the ratio becomes higher as the generation progresses.

(viii) Impact on the Logical Device

According to the results as described above, the impact upon a CMOS logical device will be discussed. With the progress in scaling, the number of errors itself increases, and therefore, the error rate increases in the same manner as the SRAM, since the logical device is also a type of CMOS. There has been described a result that in the 22 nm, the domain of around one million bits at a maximum was affected per neutron reaction in 6 transistor SRAMs, and the MCU multiplicity became 100 bits or more at a maximum. This means that errors occur concurrently in 100 or more transistors in the domain of one million or more, if it is converted to the number of transistors (corresponding to one logic circuit node). If errors occur on the nodes of 100 or more widely in the logic circuit, it is easily conceivable that any countermeasure on various systems may be disabled against the errors, including redundancy systems and a restoration circuit, such as the TMR, DMR, and DICE.

For high energy neutron rays against which a countermeasure such as a shielding is useless, it is not possible to expect an accomplishment of a perfect countermeasure for the device, without delay. Therefore, on the premise that occurrence of soft-error is inevitable, it is imperative to establish a countermeasure technique for reducing the occurrence of dangerous error and risks, to an acceptable level, in compliance with IEC61508, by immediately linking estimation of the impact on the logic circuit and system, with the device component system.

On the basis of the findings as described above, an embodiment of the present invention will be explained.

Figure 1:
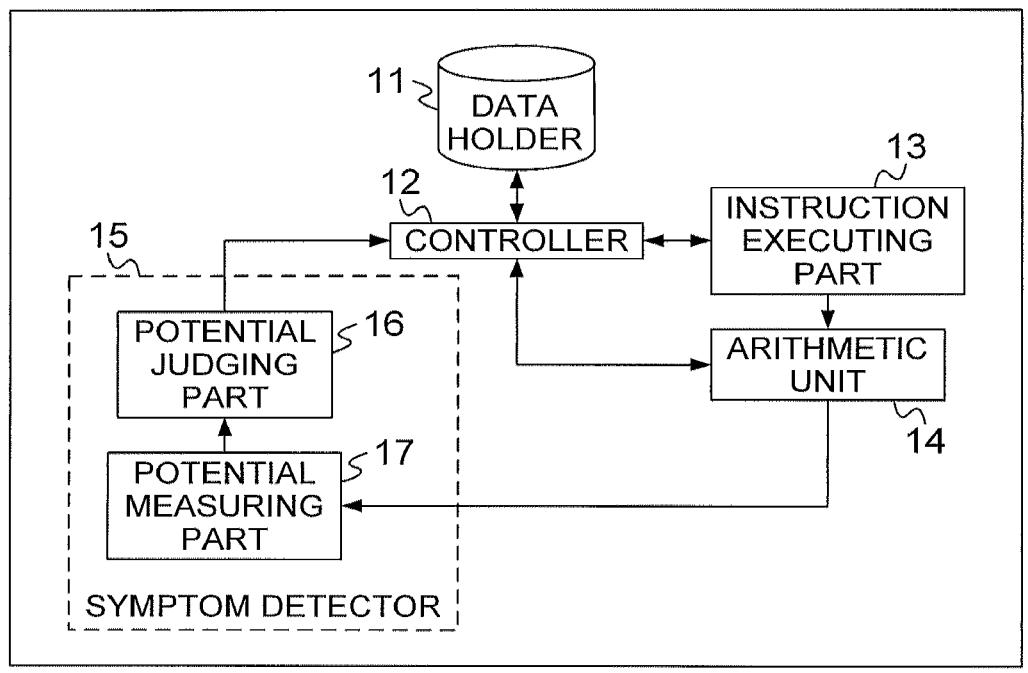
FIG. 1 is a block diagram showing a configuration of the electronic apparatus 10 relating to one embodiment of the present invention.

FIG. 1 is a block diagram showing a configuration of an electronic apparatus 10 relating to one embodiment of the present invention. The electronic apparatus 10 is provided with a data holder 11, a controller 12, and an instruction executing part 13, an arithmetic unit 14, and a symptom detector 15.

The instruction executing part 13 sequentially executes instructions described in a program, along the program being set in advance in the electronic apparatus 10, by using the arithmetic unit 14 such as a CPU (Central Processing Unit). In this program, a check point is associated with the instruction in advance, every some instructions, and upon executing the instruction associated with the check point, the instruction executing part 13 notifies the controller 12 of an ID (e.g., a value of a program counter, and the like) for identifying the instruction.

Upon receipt of a directive from the controller 12 to stop execution of the instruction, the instruction executing part 13 stops execution of the instruction using the arithmetic unit 14. Thereafter, upon receipt of a directive from the controller 12, to resume execution, together with the ID of the instruction, the instruction executing part 13 restarts execution of the instruction, according to the instruction having the ID being designated.

Upon receiving a notice from the instruction executing part 13, regarding the ID of the instruction being associated with the check point, the controller 12 holds the ID being notified, reads out the state of each flip-flop included in the sequential logic circuit within the arithmetic unit 14, and stores the data indicating each state into the data holder 11.

Upon receipt of a notice from the symptom detector 15 that a symptom of soft-error is detected, the controller 12 provides a directive to stop execution of the instruction, to the instruction executing part 13. Then, the controller 12 reads the data stored in the data holder 11, and sets the state of each flip-flop included in the sequential logic circuit within the arithmetic unit 14, in such a manner that the state of each flip-flop becomes as indicated by the data.

Then, the controller 12 calculates the ID of an instruction to be executed, subsequent to the instruction associated with the ID being held, and notifies the instruction executing part 13 of the calculated ID, thereby providing a directive to the instruction executing part 13, to restart execution of the instruction, based on the instruction associated with this ID.

Figure 2:
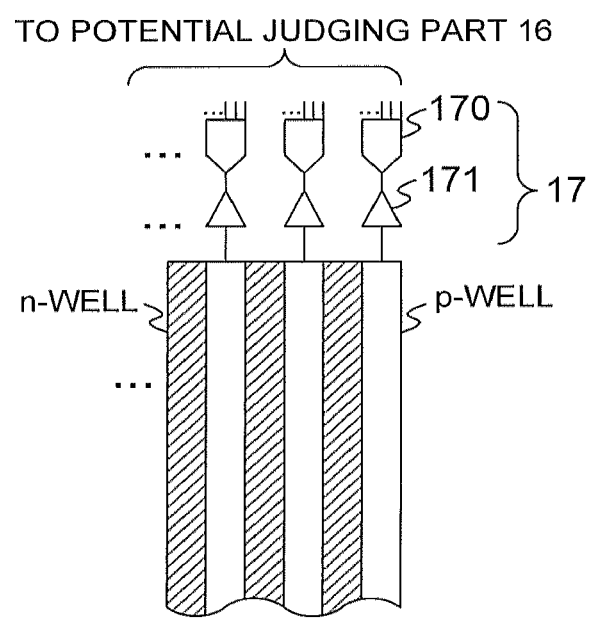
FIG. 2 is a conceptual diagram showing one detailed configuration example of the potential measurement part 17.

The symptom detector 15 includes a potential judging part 16 and a potential measuring part 17. The potential measuring part 17 measures a well potential of a semiconductor constituting the arithmetic unit 14. As shown in FIG. 2, for instance, the potential measuring part 17 includes an ADC (Analog Digital Converter) 170 and an amplifier 171.

In the present embodiment, the semiconductor within the arithmetic unit 14 has a triple well structure, and the amplifier 171 amplifies potential of the p-well. The ADC 170 converts an analog signal indicating the potential amplified by the amplifier 171 into digital data, and provides the digital data to the potential judging part 16.

It is to be noted that in an alternative embodiment, the arithmetic unit 14 may include a semiconductor having a twin well structure, and as for the semiconductor having the twin well structure, the amplifier 171 amplifies the n-well potential and transfers the amplified potential to the ADC 170.

The potential judging part 16 determines whether or not the well potential measured by the potential measuring part 17 exceeds a predetermined potential (e.g., a few volts). In the case where the well potential measured by the potential measuring part 17 exceeds the predetermined potential, the potential judging part 16 notifies the controller 12 that a symptom of the soft-error is detected.

Figure 3:
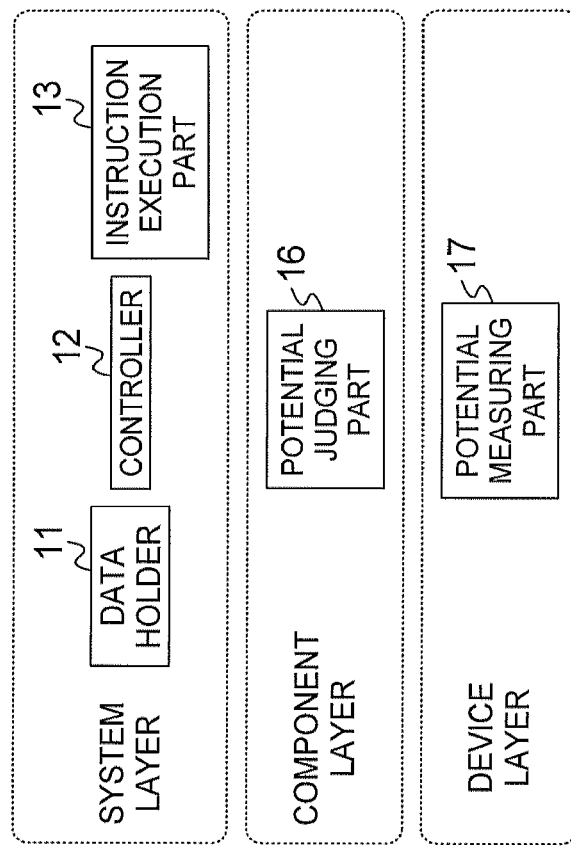
FIG. 3 is a conceptual diagram showing a system configuration of the electronic apparatus 10.

FIG. 3 is a conceptual diagram showing a system configuration of the electronic apparatus 10. As shown in FIG. 3, the electronic apparatus 10 is a system made up of three-layered structure; i.e., a lower-level device layer, an intermediate component layer, and an upper-level system layer. In the present embodiment, the data holder 11, the controller 12, and the instruction executing part 13 are implemented in the system layer, the potential judging part 16 is implemented in the component layer, and the potential measuring part 17 is implemented in the device layer.

As thus described, in the present embodiment, a measure is not taken independently in each layer against the soft-error, but a cooperative countermeasure across multiple layers solves a problem in a detection and restoration method.

Figure 4:
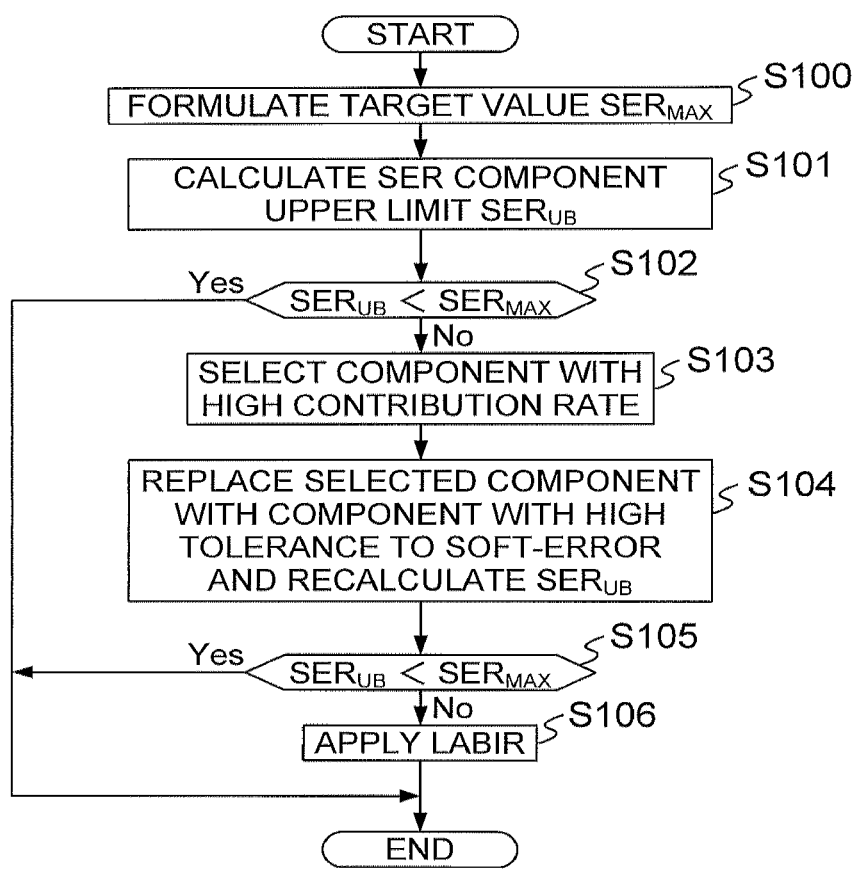
FIG. 4 is a flowchart showing one example of a design procedure considering tolerance to a soft-error.

FIG. 4 is a flowchart showing one example of a designing procedure, considering tolerance to soft-error.

Firstly, a system-wide target value $SER_{MAX}$ of the SER (Soft Error Rate) is formulated (S100). In the case where a redundant system is employed for a general electron system, the Non Patent Document 5 described below discloses a way how to formulate the target as a general setting method based on SI level.

Non Patent Document 5:

Japanese Standard Association JIS C 0508 Functional safety of electrical/electronic/programmable electronic safety-related systems (2000)

Figure 5:
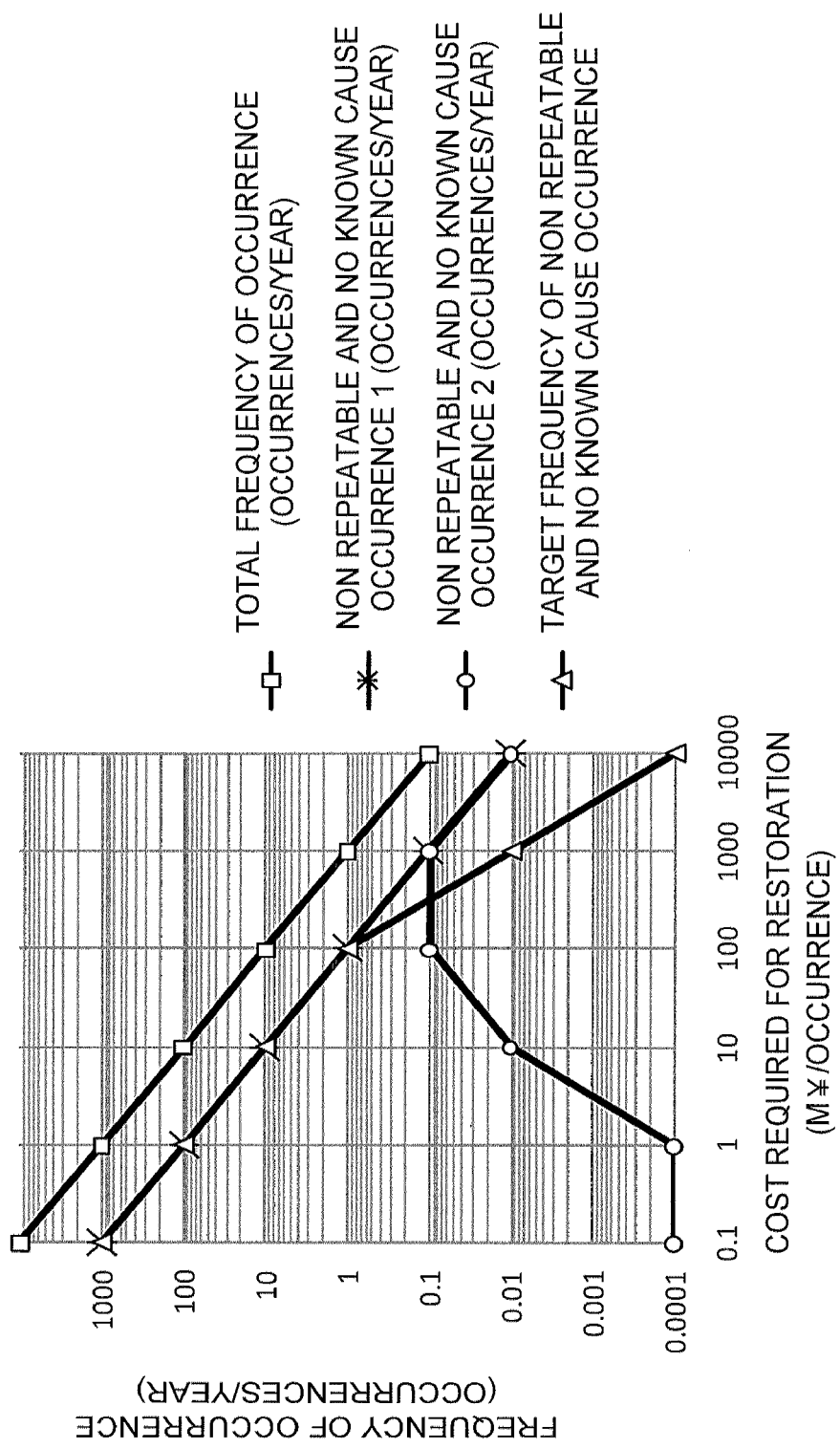
FIG. 5 is a graph showing one example of the relationship between the frequency of soft-error occurrence and cost require for restoration.

The Non Patent Document 5 discloses an idea that with regard to a network router, a time frame required for restoration is divided into four ranks, and the target is set for each rank, by using the required time and the frequency as two indexes. FIG. 5 conceptually illustrates a setting method according to the cost needed for restoration (including damage due to an accident) per accident in the electronic system, and the frequency thereof.

(1) Focusing on a specific system, actual results of the accidents are plotted, as the cost required for restoration and the frequency (count of events/year). When the data is integrated with respect to the horizontal axis, total cost required for the restoration per year is calculated.

(2) On the other hand, a target total restoration cost is determined, which makes a sufficient profit, based on an actual sales result of a target product.

(3) Some examples which are non repeatable and without any known cause, and restored by data rewriting or RESET are plotted, out of all the accident examples.

(4) Some examples which are non repeatable and without any known cause, and recovered by restarting the power source are plotted, out of all the accident examples.

The case of (3) has high possibility being caused by a soft-error other than the SEL. The case of (4) has high possibility of caused by the SEL. FIG. 5 indicates that once the SEL occurs, there is a high possibility that it becomes fatal, and therefore, the restoration tends to concentrate to high cost requirement. A target curve of the soft-error is set out of the target total restoration cost, a total annual frequency is obtained, and this is assumed as a target value $SER_{MAX}$ of the system tolerance.

Next, for each component, the count of type-i logic gates to be mounted $N_i^G$, and the count of type-j memories to be mounted $N_j^M$ are listed, and an upper limit $SER_{UB}$ of the SER for each component is obtained according to the following formula (3) (S101).

$$SER_{UB} = \sum_i (SER_i^G \times N_i^G) + \sum_i (SER_i^M \times N_i^M) \qquad (3)$$

Next, it is determined whether or not the $SER_{UB}$ is less than the target value $SER_{MAX}$ (S102). If the $SER_{UB}$ is equal to or more than the target value $SER_{MAX}$ (S102: No), a component which has a large impact and on which a countermeasure is effective is selected (some components have a large impact but only a few options of effective countermeasure are available) (S103). Specifically, a gate to be selected is a type where a product of $SER_i^G$ and $N_i^G$ is large.

Next, a component of the type being selected is replaced by a component having a high tolerance to the soft-error, and the $SER_{UB}$ is recalculated (S104). Specifically, the component of the type being selected is replaced by a gate having small $SER_i^G$. It is also possible that circuit change is performed as to the component of the type being selected, in such a manner that the number to be mounted $N_i^G$ becomes smaller, thereby reducing the product of $SER_i^G$ and $N_i^G$.

In any of the step S102 and the step S105, when the $SER_{UB}$ becomes less than the target value $SER_{MAX}$, the SER to achieve the system-wide target value is satisfied, and therefore the process is terminated without executing the designing method according to the present embodiment as shown in the step S106.

If the $SER_{UB}$ is still equal to or higher than the target value $SER_{MAX}$ even after the measure is taken in the step S104, a method of the present embodiment as shown in the step S106 (LABIR: Inter-Layer Built-in Reliability) is executed. As illustrated in FIG. 1 and FIG. 3, the LABIR is a technique for effectively prevent a failure which is caused by the soft-error including MNU, by the cooperation among the functions respectively provided in different levels.

Figure 6:
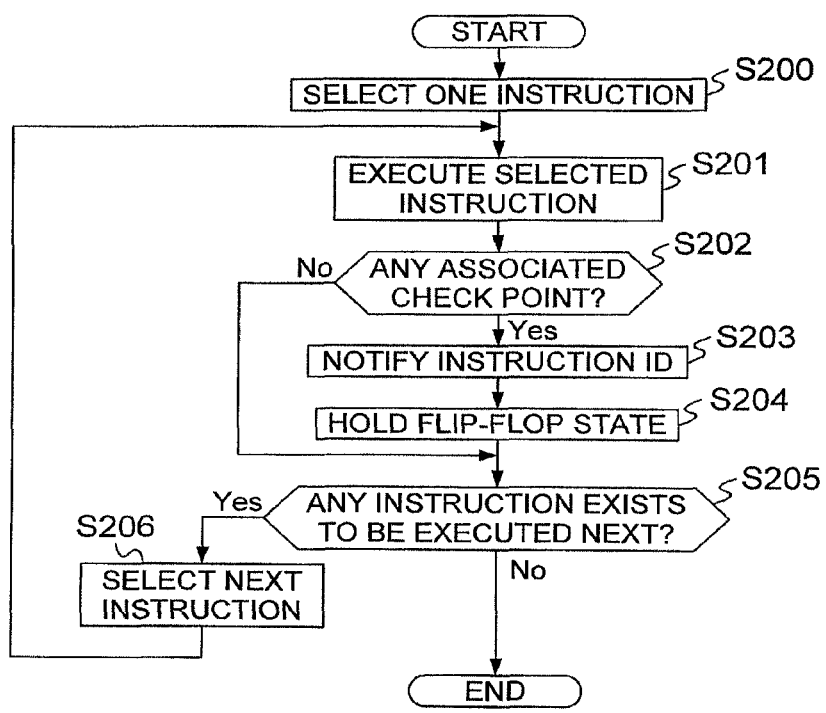
FIG. 6 is a flowchart showing one example of an instruction execution cycle being executed by the electronic apparatus 10.

FIG. 6 is a flowchart showing one example of the instruction execution cycle, being executed by the electronic apparatus 10. By way of example, upon receipt of a directive from a user via an input unit not illustrated, the electronic apparatus 10 starts the operation as shown in this flowchart.

Firstly, the instruction executing part 13 reads a program stored in a memory such as ROM (Read Only Memory) not illustrated, which is provided within the electronic apparatus 10, selects one instruction included in the program (S200), and executes the selected instruction by using the arithmetic unit 14 (S201).

Next, the instruction executing part 13 determines whether or not the selected instruction is associated with the check point (S202). If the selected instruction is not associated with the check point (S202: No), the instruction executing part 13 executes the process as shown in the step S205.

On the other hand, if the selected instruction is associated with the check point (S202: Yes), the instruction executing part 13 notifies the controller 12 of the ID of the selected instruction (S203). The controller 12 which has received the notice of the ID from the instruction executing part 13, holds the ID being notified, and reads each flip-flop state included in the sequential logic circuit within the arithmetic unit 14, and allows the data holder 11 to hold the data indicating the state (S204).

Next, the instruction executing part 13 refers to the program stored in the memory within the electronic apparatus 10, and determines whether or not there exists any instruction to be executed next (S205). If there is no instruction to be execute next (S205: No), the electronic apparatus 10 terminates the operation shown in the flowchart.

On the other hand, if there exists an instruction to be executed next (S205: Yes), the instruction executing part 13 refers to the program stored in the memory within the electronic apparatus 10, selects the instruction to be executed next (S206), and again executes the process as shown in the step S201.

Figure 7:
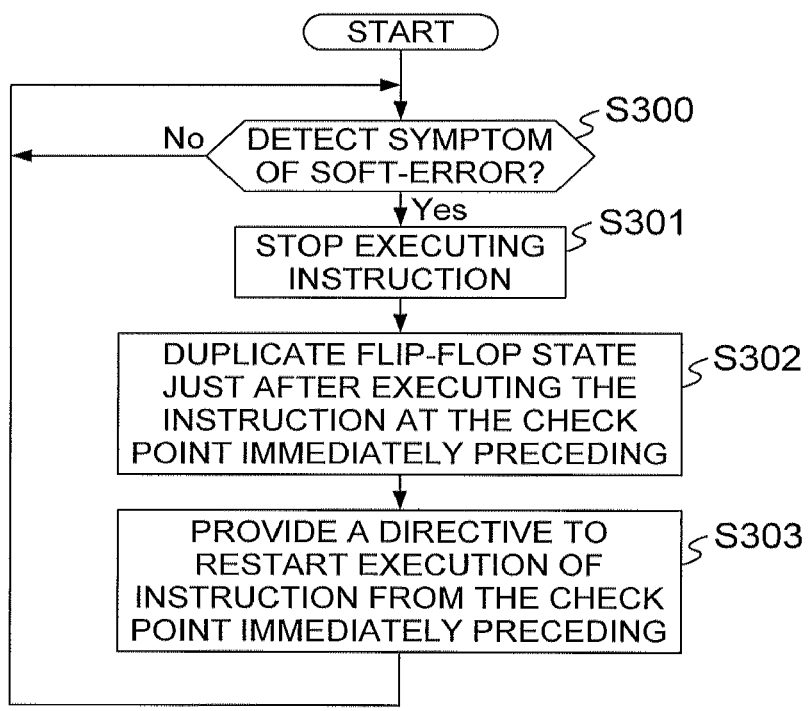
FIG. 7 is a flowchart showing one example of interrupt processing of the electronic apparatus 10.

FIG. 7 is a flowchart showing one example of an interrupt processing executed by the electronic apparatus 10. It is to be noted that the symptom detector 15 measures the well potential of the semiconductor within the arithmetic unit 14, and monitors whether or not the well potential being measured exceeds a predetermined potential, thereby determining whether or not there exists a symptom of the soft-error.

Firstly, the controller 12 determines whether or not the symptom detector 15 has detected a symptom of the soft-error (S300). If the symptom detector 15 detects the symptom of the soft-error (S300: Yes), the controller 12 provides the instruction executing part 13, a directive to stop execution of the instruction (S301).

Next, the controller 12 reads the data stored in the data holder 11, and configures settings of each flip-flop state within the arithmetic unit 14 in such a manner that the state becomes as indicated by the data thus read out, thereby duplicating the flip-flop state just after executing the instruction at the check point immediately preceding (S302).

Next, the controller 12 calculates an ID of the instruction to be executed next to the instruction associated with the ID being held (i.e., the instruction associated with the check point immediately preceding), notifies the instruction executing part 13 of the calculated ID, thereby providing a directive to the instruction executing part 13, to restart execution of the instruction from the instruction associated with the calculated ID (S303), and executes the process as shown in the step S300 again.

An embodiment of the present invention has been explained so far.

As obvious from the explanation described above, according to the electronic apparatus 10 of the present embodiment, only when the symptom of the soft-error is detected, duplication is performed for the state of the flip-flop at the point when the instruction associated with the check point immediately preceding is executed, and execution of the instruction is restarted from the instruction which is subsequent to the one associated with the check point immediately preceding.

Since the soft-error occurs approximately once in a few days, the redundant processing time is extremely short time relative to the normal processing time, the redundant processing being caused by the overhead for restarting the process after returning to the check point immediately preceding. Therefore, it is possible to keep at a low level, the increase of the system-wide processing time due to the soft-error countermeasure.

Since the electronic apparatus 10 of the present embodiment executes all the processes only once, unless a symptom of the soft-error is detected, and therefore, it is possible to keep at a lower level the system-wide increase of processing time and power consumption due to the soft-error countermeasure, compared to the Replication+rollback in which all the processes are executed twice.

In addition, the electronic apparatus 10 requires only one processing system, it is possible to keep at a low level the increase of mounting area and power consumption, compared to Duplication+Comparison+checkpoint which duplicates the processing system, and the TMR which triplicates the processing system.

Therefore, the electronic apparatus 10 of the present embodiment suppresses the increase of the mounting area, power consumption, and processing time, and further prevents a failure of the electronic apparatus, caused by the soft-error including the MNU.

It is to be noted that the present invention is not limited to the embodiment described above, but various modifications are possible within the scope of the invention.

By way of example, in the embodiment described above, the symptom detector 15 measures a well potential of the semiconductor within the arithmetic unit 14, and determines whether or not there is a symptom of the soft-error, by monitoring whether or not the well potential being measured exceeds a predetermined potential. However, the present invention is not limited to this example.

Figure 8:
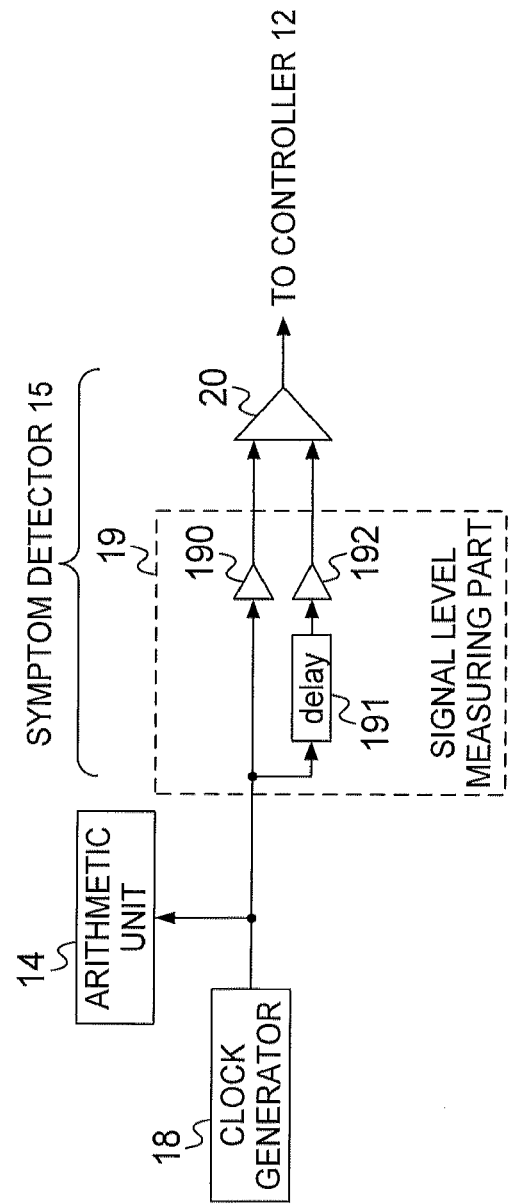
FIG. 8 is a block diagram showing alternative example of the symptom detector 15.

By way of example, as shown in FIG. 8, it is further possible that the symptom detector 15 monitors a clock waveform generated by a clock generator 18 and supplied to the arithmetic unit 14, and upon detecting fluctuations in the clock waveform, the controller 12 is notified that a symptom of the soft-error is detected. On this occasion, the symptom detector 15 is provided with a signal level measuring part 19 and a signal level judging part 20.

The signal level measuring part 19 incorporates an amplifier 190 for amplifying a clock signal generated by the clock generator 18, a delay circuit 191 for delaying the clock signal generated by the clock generator 18, by a predetermined time (e.g., the time being integral multiple of the clock cycle), and an amplifier 192 for amplifying the clock signal being delayed by the delay circuit 191.

The signal level judging part 20 compares a signal level of the clock signal amplified by the amplifier 190 with the signal level of the clock signal amplified by the amplifier 192, and when a difference between the both signal levels is equal to or more than a predetermined margin of error, the controller 12 is notified that the symptom of soft-error is detected. It is to be noted that in the system configuration as shown in FIG. 3, the signal level judging part 20 is implemented in the component layer, and the signal level measuring part 19 is implemented in the device layer.

Figure 9:
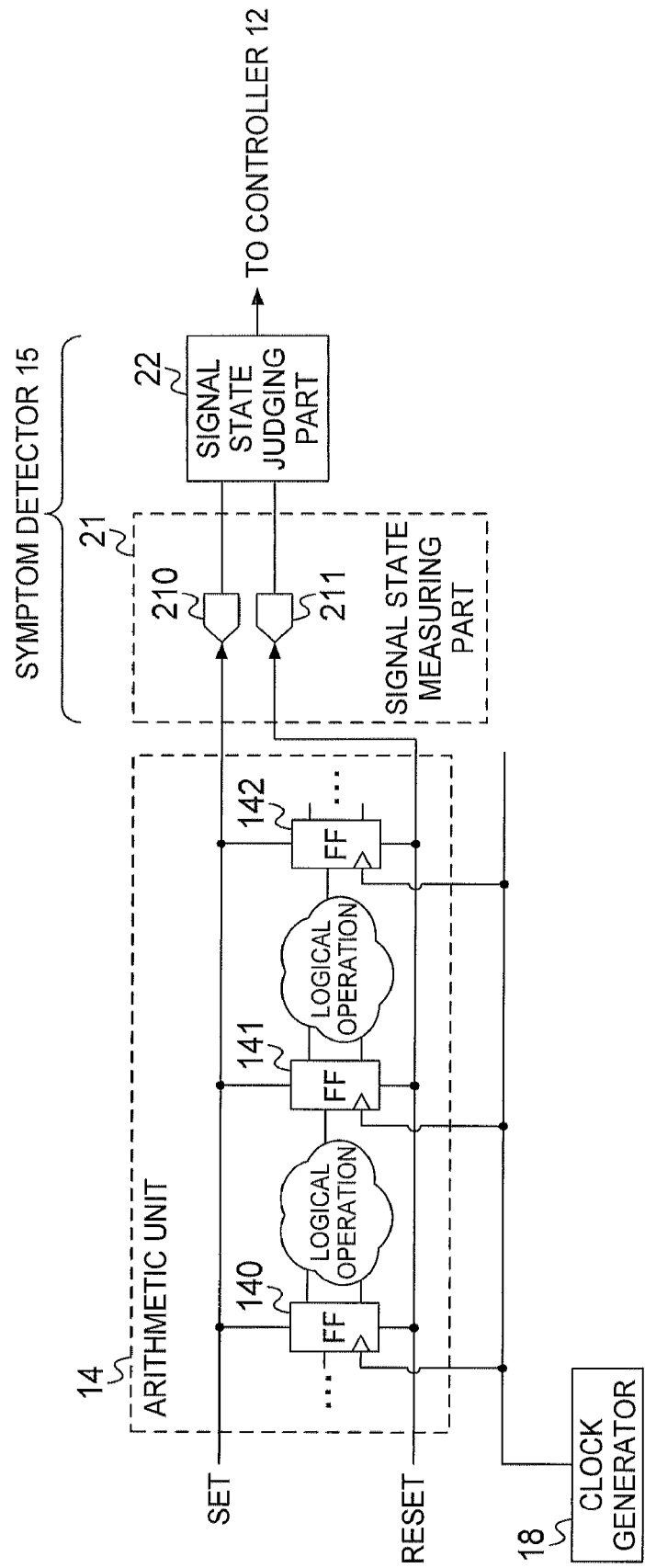
FIG. 9 is a block diagram showing further alternative example of the symptom detector 15.
Figure 10:
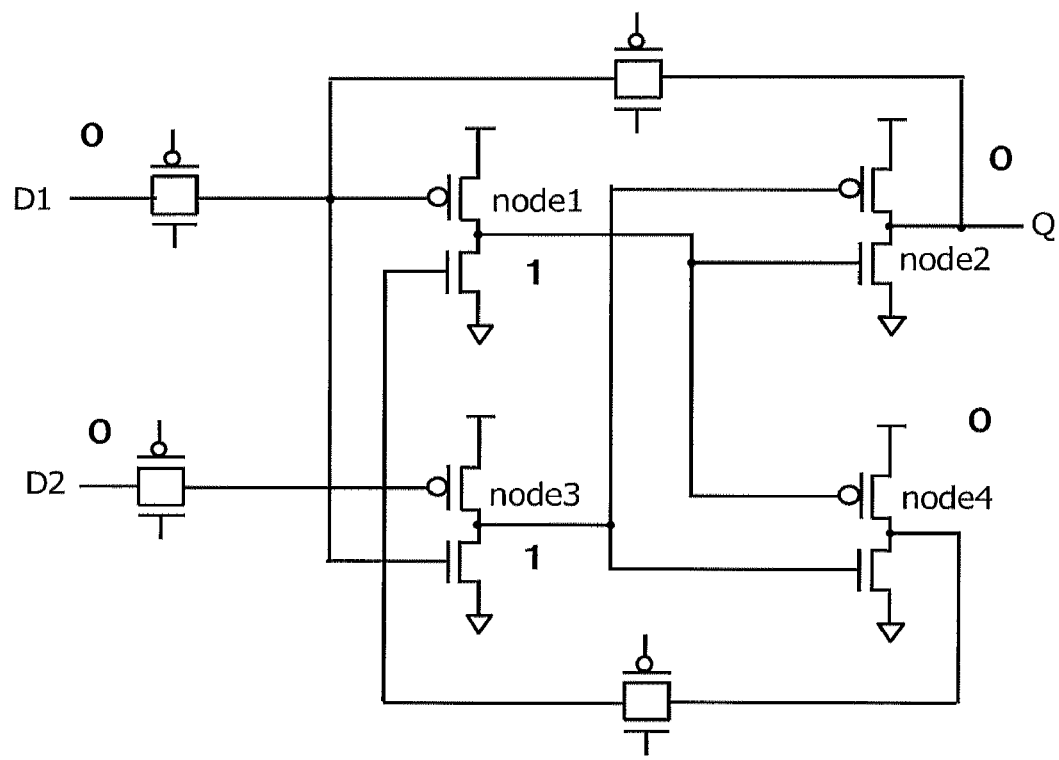
FIG. 10 is a diagram showing a configuration of the tolerant latch DICE suggested by Calin.

By way of example, as shown in FIG. 9, it is also possible that the symptom detector 15 monitors a SET signal and a RESET signal supplied to the flip-flops 140 to 142, within the arithmetic unit 14, and if the signal is not in the state responding to the instruction described in the program, the controller 12 may be notified that the symptom of the soft-error is detected. On this occasion, the symptom detector 15 is provided with a signal state measuring part 21, and a signal state judging part 22.

The signal state measuring part 21 incorporates an ADC 210 for converting the SET signal to a digital value, and an ADC 211 for converting the RESET signal to a digital value. The signal state judging part 22 monitors each signal level, and determines whether or not the signal is within the domain of signal level associated with the signal state responding to the instruction described in the program. If the SET signal or the RESET signal is not within the domain of signal level responding to the instruction described in the program, the signal state measuring part 21 notifies the controller 12 that a symptom of soft-error is detected.

It is to be noted that on this occasion, it is necessary for the signal state judging part 22 to know the signal state responding to the instruction described in the program, as to each of the SET signal and the RESET signal. Therefore, the signal state judging part 22 is implemented in the system layer as shown in FIG. 3. On the other hand, the signal state measuring part 21 is implemented in the device layer as shown in FIG. 3.

By way of example, it is further possible that the symptom detector 15 monitors a rise of the well potential, fluctuations in the clock signal, and abnormality of the SET signal or the RESET signal. When any of these described above is detected, the controller 12 may be notified that a symptom of the soft-error is detected. Accordingly, the detection of a symptom of the soft-error is ensured more, and it is possible to enhance the reliability of the system.

FIG. 30 shows that the current value increases discretely depending on the multiplicity of the MNU, in the case of the MCBI. The increase of source current absolutely indicates another symptom of error. Since the potential of the wiring for supplying the source potential fluctuates as well, if a potential of a part having electrical resistance to the ground is measured, on the wiring from the power source to the ground, and it is used as the potential measuring part 17 of FIG. 1, it is possible to obtain an equivalent effect of the embodiment as shown in FIG. 2 where the well potential is measured.

EXPLANATION OF REFERENCES

10 . . . ELECTRONIC APPARATUS, 11 . . . DATA HOLDER, 12 . . . CONTROLLER, 13 . . . INSTRUCTION EXECUTING PART, 14 . . . ARITHMETIC UNIT, 140 . . . FLIP-FLOP, 141 . . . FLIP-FLOP, 142 . . . FLIP-FLOP, 15 . . . SYMPTOM DETECTOR, 16 . . . POTENTIAL JUDGING PART, 17 . . . POTENTIAL MEASURING PART, 170 . . . ADC, 171 . . . AMPLIFIER, 18 . . . CLOCK GENERATOR, 19 . . . SIGNAL LEVEL MEASURING PART, 190 . . . AMPLIFIER, 191 . . . DELAY CIRCUIT, 192 . . . AMPLIFIER, 20 . . . SIGNAL LEVEL JUDGING PART, 21 . . . SIGNAL STATE MEASURING PART, 210 . . . ADC, 211 . . . ADC, 22 . . . SIGNAL STATE JUDGING PART

What is claimed is:

1. An electronic apparatus having a function for avoiding a failure caused by a soft-error, comprising, an instruction executing part for executing an instruction sequentially according to a program being set, by using an arithmetic unit held by the electronic apparatus, a data holder for holding data indicating a state of a flip-flop included in a sequential logic circuit within the arithmetic unit, a symptom detector for detecting a symptom of the soft-error, and a controller for allowing the data holder to hold the data indicating the state of the flip-flop included in the sequential logic circuit within the arithmetic unit, for the case where the instruction executing part executes the instruction associated with a check point, without detecting the symptom of the soft-error by the symptom detector; and for the case where the symptom detector detects the symptom of the soft-error, the controller providing a directive to the instruction executing part to stop executing the instruction, setting the state of the flip-flop included in the sequential logic circuit within the arithmetic unit based on the data held by the data holder, and providing a directive to the instruction executing part to restart executing the next instruction, being subsequent to the instruction associated with the check point immediately preceding.

2. The electronic apparatus according to claim 1, wherein, the symptom detector comprises, a potential measuring part for measuring a well potential of a semiconductor constituting the arithmetic unit, and a potential judging part for outputting a notice that the symptom of the soft-error is detected, when the well potential measured by the potential measuring part exceeds a predetermined potential.

3. The electronic apparatus according to claim 2, wherein, the semiconductor constituting the arithmetic unit has either of a triple well structure or a twin well structure, the potential measuring part measures a potential of p-well as to the semiconductor having the triple well structure, and measures a potential of n-well as to the semiconductor having the twin well structure, and the potential judging part performs a comparison, as to the semiconductor having each of the structures, between the well potential measured by the potential measuring part and the predetermined potential, in order to detect whether or not the symptom of the soft-error exists.

4. The electronic apparatus according to either of claim 2 and claim 3, wherein,
- the electronic apparatus is configured as a system made up of a three-layered structure including a lower-level device layer, an intermediate component layer, and an upper-level system layer,
- the potential measuring part is implemented in the device layer,
- the potential judging part is implemented in the component layer, and
- the instruction executing part, the data holder, and the controller are implemented in the system layer.

5. The electronic apparatus according to claim 1, wherein, the symptom detector comprises,
- a signal level measuring part for measuring a signal level of a clock signal supplied to the arithmetic unit, and
- a signal level judging part for outputting a notice that the symptom of the soft-error is detected, when the signal level of the clock signal measured by the signal level measuring part is out of the domain of a predetermined signal level.

6. The electronic apparatus according to claim 5, wherein,
- the electronic apparatus is configured as a system made up of a three-layered structure including a lower-level device layer, an intermediate component layer, and an upper-level system layer,
- the signal level measuring part is implemented in the device layer,
- the signal level judging part is implemented in the component layer, and
- the instruction executing part, the data holder, and the controller are implemented in the system layer.

7. The electronic apparatus according to claim 1, wherein, the symptom detector comprises,
- a signal state measuring part for measuring a state of SET/RESET signal, the state being supplied to the flip-flop included in the sequential logic circuit within the arithmetic unit, and
- a signal state judging part for outputting a notice that the symptom of the soft-error is detected, when the state of SET/RESET signal measured by the signal state measuring part is different from the state which is to be set in a process of executing the instruction in accordance with the program.

8. The electronic apparatus according to claim 7, wherein,
- the electronic apparatus is configured as a system made up of a two-layered structure including a lower-level device layer and an upper-level system layer,
- the signal state measuring part is implemented in the device layer, and
- the instruction executing part, the data holder, the controller, and the signal state judging part are implemented in the system layer.

9. The electronic apparatus according to claim 1, wherein, the symptom detector comprises,
- a potential measuring part for measuring a potential of a power-supply line staring from a power source up to a ground of a semiconductor constituting the arithmetic unit, and
- a potential judging part for outputting a notice that the symptom of the soft-error is detected, when the potential of the power-supply line measured by the potential measuring part exceeds a predetermined potential.

\* \* \* \* \*